United States Patent
Akiyama et al.

(10) Patent No.: US 9,595,660 B2
(45) Date of Patent: Mar. 14, 2017

(54) METHOD OF MANUFACTURING ELECTROMECHANICAL TRANSDUCER, ELECTROMECHANICAL TRANSDUCER, DROPLET DISCHARGE HEAD, DROPLET DISCHARGE APPARATUS, AND IMAGE FORMING APPARATUS

(71) Applicants: Yoshikazu Akiyama, Kanagawa (JP); Naoya Kondo, Kanagawa (JP); Satoshi Mizukami, Kanagawa (JP)

(72) Inventors: Yoshikazu Akiyama, Kanagawa (JP); Naoya Kondo, Kanagawa (JP); Satoshi Mizukami, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 36 days.

(21) Appl. No.: 14/643,296

(22) Filed: Mar. 10, 2015

(65) Prior Publication Data

US 2015/0263263 A1    Sep. 17, 2015

(30) Foreign Application Priority Data

Mar. 13, 2014 (JP) ................. 2014-050687

(51) Int. Cl.
    *B41J 2/14* (2006.01)
    *B41J 2/16* (2006.01)
    (Continued)

(52) U.S. Cl.
    CPC ........ *H01L 41/253* (2013.01); *B41J 2/14201* (2013.01); *B41J 2/14233* (2013.01);
    (Continued)

(58) Field of Classification Search
    CPC ...... B41J 2/14233; B41J 2/161; B41J 2/1621; H01L 41/257
    See application file for complete search history.

(56) References Cited

U.S. PATENT DOCUMENTS 4,883,766 A   11/1989   Ishida et al.
5,555,219 A    9/1996   Akiyama et al.
(Continued)

FOREIGN PATENT DOCUMENTS

JP   2005-123421   5/2005
JP   2009-062207   3/2009
JP   2010-034154   2/2010

OTHER PUBLICATIONS

U.S. Appl. No. 14/484,743, filed Sep. 12, 2014.

*Primary Examiner* — Kristal Feggins
*Assistant Examiner* — Kendrick Liu
(74) *Attorney, Agent, or Firm* — Cooper & Dunham LLP

(57) ABSTRACT

A method of manufacturing an electromechanical transducer includes forming a first electrode on a substrate or a base film, forming a piezoelectric film made of lead zirconate titanate on the first electrode, forming a second electrode on the piezoelectric film, and polarizing the piezoelectric film. The polarizing includes applying to the second electrode a positive polarity voltage having a positive polarity relative to a potential of the first electrode, and satisfying a first expression of $-Ec^P-(-Ec)<0$ and a second expression of $|-Ec^P-(-Ec)|>0.15 \times Ec^{Pav}$, where $-Ec$ represents an initial coercive field of a negative polarity side of the electromechanical transducer, $-Ec^P$ represents a coercive field of the negative polarity side after the applying, $Ec^P$ represents a coercive field of a positive polarity side after the applying, and $Ec^{Pav}$ represents an average of absolute values of the coercive field $-Ec^P$ and the coercive field $Ec^P$.

6 Claims, 13 Drawing Sheets

(51) Int. Cl.
   *H01L 41/04*    (2006.01)
   *H01L 41/253*   (2013.01)
   *H01L 41/27*    (2013.01)
   *H01L 41/09*    (2006.01)
   *H01L 41/257*   (2013.01)

(52) U.S. Cl.
   CPC ............ *B41J 2/161* (2013.01); *B41J 2/1629* (2013.01); *B41J 2/1631* (2013.01); *B41J 2/1642* (2013.01); *B41J 2/1645* (2013.01); *B41J 2/1646* (2013.01); *H01L 41/042* (2013.01); *H01L 41/0973* (2013.01); *H01L 41/257* (2013.01); *H01L 41/27* (2013.01); *B41J 2002/1425* (2013.01); *B41J 2002/14258* (2013.01); *B41J 2002/14266* (2013.01); *Y10T 29/42* (2015.01)

(56) References Cited

U.S. PATENT DOCUMENTS

| | | | |
|---|---|---|---|
| 5,610,853 | A | 3/1997 | Akiyama et al. |
| 2003/0223138 | A1 | 12/2003 | Akiyama |
| 2005/0156244 | A1 | 7/2005 | Akiyama |
| 2006/0197415 | A1* | 9/2006 | Nakashio et al. ............ 310/365 |
| 2006/0261708 | A1* | 11/2006 | Li et al. ......................... 310/358 |
| 2010/0277524 | A1* | 11/2010 | Morita .................. B41J 2/0451 347/9 |
| 2013/0002767 | A1 | 1/2013 | Mizukami et al. |
| 2013/0070029 | A1 | 3/2013 | Mizukami et al. |
| 2013/0250007 | A1 | 9/2013 | Ishimori et al. |
| 2013/0250009 | A1 | 9/2013 | Ishimori et al. |

* cited by examiner

METHOD OF MANUFACTURING ELECTROMECHANICAL TRANSDUCER, ELECTROMECHANICAL TRANSDUCER, DROPLET DISCHARGE HEAD, DROPLET DISCHARGE APPARATUS, AND IMAGE FORMING APPARATUS

CROSS-REFERENCE TO RELATED APPLICATIONS

This patent application is based on and claims priority pursuant to 35 U.S.C. §119(a) to Japanese Patent Application No. 2014-050687, filed on Mar. 13, 2014, in the Japan Patent Office, the entire disclosure of which is hereby incorporated by reference herein.

BACKGROUND

Technical Field

Embodiments of this disclosure relate to a method of manufacturing an electromechanical transducer having a piezoelectric film, an electromechanical transducer, a droplet discharge head having the electromechanical transducer, and a droplet discharge apparatus and an image forming apparatus having the droplet discharge head.

Description of the Related Art

An image forming apparatus or a three-dimensional shaping apparatus such as a printer, a fax machine, and a copier is known that includes a droplet discharge head to discharge droplets. The droplet discharge head includes nozzles to discharge droplets, a liquid chamber (also referred to as ink channel, pressure liquid chamber, compression chamber, pressure chamber, discharge chamber, or individual liquid chamber) which the nozzles communicate with, and a heat generator to generate pressure in liquid in the liquid chamber. The liquid in the liquid chamber is pressurized by an energy generator, so that the droplets can be discharged from the nozzles communicating with the liquid chamber.

As systems for the droplet discharge head, for example, a piezoelectric system using an electromechanical transducer having a piezoelectric film, a heating system using an electrothermal transducer such as a heater, and an electrostatic system using a diaphragm forming a wall surface of a compression chamber and an electrode facing the vibration plate are known.

As droplet discharge heads using the piezoelectric system, for example, two types of droplet discharge heads are known: one using an electromechanical transducer vibrating in a vertical vibration mode and the other using an electromechanical transducer vibrating in a flexural vibration mode. The vertical vibration mode is a vibration mode in which a piezoelectric film is deformed to extend and contract in a thickness direction (a direction of a center axis) and the flexural vibration mode is a vibration mode in which an entire piezoelectric film is deformed to bend. For electromechanical transducers that vibrate in the vibration mode, fatigue phenomenon is known that the deformation amount (surface displacement amount) of the piezoelectric film applied with a drive voltage decreases over time.

SUMMARY

In at least one aspect of this disclosure, there is provided an improved method of manufacturing an electromechanical transducer. The method includes forming a first electrode on a substrate or a base film, forming a piezoelectric film made of lead zirconate titanate on the first electrode, forming a second electrode on the piezoelectric film, and polarizing the piezoelectric film. The polarizing includes applying to the second electrode a positive polarity voltage having a positive polarity relative to a potential of the first electrode, and satisfying a first expression of $-Ec^P - (-Ec) < 0$ and a second expression of $|-Ec^P - (-Ec)| > 0.15 \times Ec^{Pav}$, where $-Ec$ represents an initial coercive field of a negative polarity side of the electromechanical transducer, $-Ec^P$ represents a coercive field of the negative polarity side of the electromechanical transducer after the applying of the positive polarity voltage to the second electrode, $Ec^P$ represents a coercive field of a positive polarity side of the electromechanical transducer after the applying of the positive polarity voltage to the second electrode, and $Ec^{Pav}$ represents an average of an absolute value of the coercive field $-Ec^P$ and an absolute value of the coercive field $Ec^P$.

In at least one aspect of this disclosure, there is provided an electromechanical transducer manufactured by the method.

In at least one aspect of this disclosure, there is provided a droplet discharge head including the electromechanical transducer manufactured by the method.

In at least one aspect of this disclosure, there is provided a droplet discharge apparatus including the droplet discharge head.

In at least one aspect of this disclosure, there is provided an image forming apparatus including the droplet discharge head.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
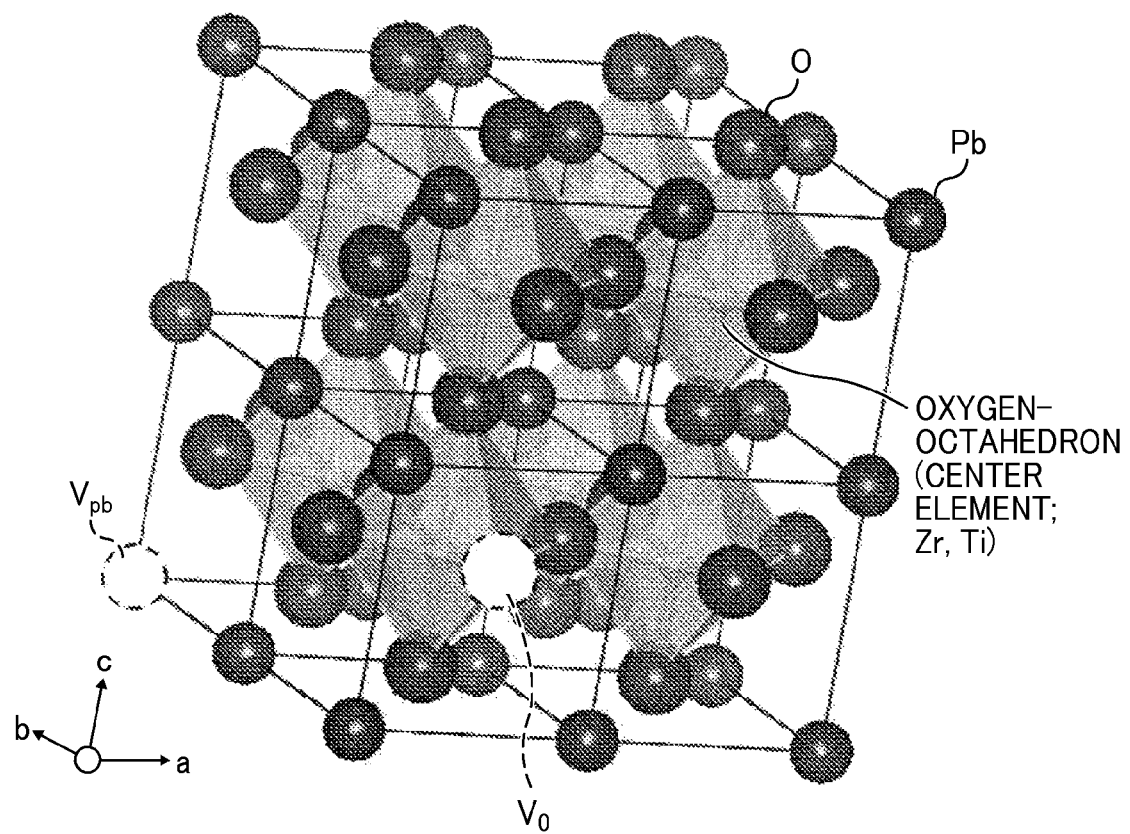
FIG. 1 is a perspective view schematically illustrating 2×2×2 cells of a crystal lattice of PZT to be an example of a piezoelectric material.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Hereinafter, embodiments of the present disclosure will be described with reference to the drawings.

An electromechanical transducer having a piezoelectric film according to the present disclosure can be applied to a droplet discharge head, a droplet discharge apparatus, and an image forming apparatus using the droplet discharge head. The image forming apparatus using the droplet discharge head is generally called an inkjet recording apparatus. The inkjet recording apparatus has many advantages in that noise is extremely small, high-speed printing is enabled, a degree of freedom of ink exists, and cheap plain paper can be used. Therefore, the inkjet recording apparatus is developed widely as image forming apparatuses (including an image recording apparatus) such as a printer, a fax machine, and a copier.

The droplet discharge head used in the inkjet recording apparatus includes nozzles to discharge ink droplets as droplets, a liquid chamber which the nozzles communicate with, and a pressure generator to generate pressure to discharge ink in the liquid chamber. The liquid chamber is also called a discharge chamber, a pressure liquid chamber, a pressure chamber, and an ink channel.

As the pressure generator, a pressure generator of a piezoelectric type and a pressure generator of a thermal type (a bubble type) are known. The pressure generator of the piezoelectric type deforms/displaces a diaphragm forming a wall surface of a discharge chamber using an electromechanical transducer such as a piezoelectric element and discharges ink droplets. The pressure generator of the thermal type (bubble type) generates bubbles by film boiling using an electromechanical transducer such as a heat element arranged in a liquid chamber and discharges ink droplets. As examples of the piezoelectric type, a vertical vibration (a push mode) type using deformation of a d33 direction of a piezoelectric material, a horizontal vibration (a bend mode) type using deformation of a d31 direction, and a shear mode type using shear deformation are known. Recently, with the advancement of a semiconductor processor or a micro electro mechanical system (MEMS), a thin-film actuator obtained by forming a liquid chamber and an electromechanical transducer on a Si substrate directly is known.

The piezoelectric element to be the electromechanical transducer used for the pressure generator of the piezoelectric type has the property that charges are generated when stress is applied to the piezoelectric material and the piezoelectric material is extended when a field is applied to the piezoelectric material. As the piezoelectric material, lead zirconate titanate (PZT) is known, for example.

However, if the piezoelectric element is used repetitively, the piezoelectric material may be extended in a direction of the application field and a displacement amount for the application voltage may decrease. In addition, crystal of the piezoelectric material is configured by a collection of domains of which polarization directions are aligned. However, a polarization axis may be fixed by pinning of a polarization domain caused by oxygen loss and the displacement amount may decrease.

In the inkjet recording apparatus on which the electromechanical transducer is mounted, the deformation/displacement of the electromechanical transducer and the diaphragm may change over drive time and characteristics of the discharge droplets such as the volume and the discharge speed of the discharge droplets may be unstable. This problem occurs in other liquid discharge apparatuses to discharge liquids other than ink, in addition to the inkjet recording apparatus to discharge the ink.

In general, the piezoelectric material such as the electromechanical transducer and the PZT used as the electromechanical transducer is divided into a large number of domains of which polarization directions in the crystal (a vector direction of electric dipole moment) are different from each other. The polarization directions in the domains are aligned, so that electromechanical transduction ability is developed. When the piezoelectric film is a thin film, a film thickness is sufficiently small and a field of sufficiently large intensity can be applied even when a voltage of several [V] is applied. Therefore, the polarization direction in each domain is aligned when the voltage is applied and distortion according to the voltage application can be developed.

However, actually, the polarization direction in each domain in the crystal of the piezoelectric material is not aligned. That is, the polarization direction (the vector direction of the electric dipole moment) of each domain is random. Here, domain walls corresponding to boundaries of the domains adjacent to each other in the piezoelectric material can be roughly divided into 180° domain walls and the other angle domain walls. An angle formed by the polarization directions between the domains adjacent to each other with the 180° domain walls therebetween is 180° and an angle formed by the polarization directions between the domains adjacent to each other with the other angle domain walls therebetween is an angle other than 180°.

In the case of the 180° domain walls, ions may be moved only to align the polarization directions of the domains adjacent to each other with the domain walls therebetween. Therefore, the polarization direction of each domain is aligned even when the application voltage is a low voltage.

Meanwhile, in the case of the other angle domain walls, it is necessary to perform mechanical defoimation of the domains to align the polarization directions of the domains adjacent to each other with the domain walls therebetween. For this reason, it is difficult to align the polarization direction of each domain. However, in the thin-film piezoelectric material, because the field of the sufficiently large intensity is applied to the piezoelectric film at the time of actual driving, the polarization direction of each domain is aligned as the domain gradually rotates. The magnitude of the polarization for the drive voltage applied at the time of actual driving decreases over time, by the rotation of the domain at the time of actual driving. According to the decrease in the magnitude of the polarization, electromechanical transduction ability of the electromechanical transducer, that is, a surface displacement amount per unit drive voltage may decrease over time.

In this embodiment, the polarization direction of each domain of the piezoelectric film is aligned at an initial step before actual driving starts, by a polarization process to be described below. Thereby, rotation of the domain at the time of actual driving can be suppressed and the temporal change of the surface displacement amount of the electromechanical transducer can be suppressed. In addition, because the polarization direction of each domain is already aligned at the time of actual driving, the polarization direction of each domain rarely returns to an original state at the time of non-driving. From this point, the temporal change of the surface displacement amount of the electromechanical transducer can be suppressed.

For example, in a method of manufacturing a thin-film piezoelectric element according to a comparative example, an aging process for applying a voltage higher than an actual drive voltage, that is, a waveform of a high frequency is execute to stabilize a temporal change of a displacement amount of the electromechanical transducer over drive time. The aging process is a process for applying an aging voltage to the piezoelectric element and stabilizing a deformation characteristic (a surface displacement characteristic) for a drive pulse voltage of the piezoelectric element. A waveform of the aging voltage is a waveform in which a state in which the waveform rises from a negative polarity voltage equivalent to a coercive field of the piezoelectric film (a dielectric layer) to a high voltage more than a positive polarity drive pulse voltage at the time of use and falls from the positive polarity high voltage to the negative polarity voltage equivalent to the coercive field. Here, the "positive polarity" voltage is a voltage to generate a field to strengthen polarization of a direction equal to a direction of spontaneous polarization of the piezoelectric film and the "negative polarity" voltage is a voltage to generate a field to strengthen polarization of a direction opposite to the direction of the spontaneous polarization of the piezoelectric film.

By the aging process, the temporal change of the surface displacement amount to be the deformation amount of the electromechanical transducer can be converged before actual driving and can be stabilized. In addition, for example, the aging process is executed for 20 to 120 minutes while applying a voltage of 120% of the drive voltage with a triangular wave or a sine wave of a repetition frequency of 33 [Hz] to 100 [kHz]. If the aging process ends in short time, productivity is improved.

However, the present inventors have conducted studies and experiments zealously and have found that the fatigue phenomenon of the deformation amount (the surface displacement amount) of the piezoelectric film decreasing over time may not be surely prevented in the aging process according to the comparative example. Specifically, the present inventors have found that, when a predetermined drive pulse signal (an amplitude width: 0 to 30 [V], a cycle: 50 [µsec], and a duty ratio: 50%) used for an application to the image forming apparatus is repetitively applied to the piezoelectric element of the PZT subjected to the aging process according to the related art, both rising and falling times of the drive pulse signal are 1.6 [µsec], the number of times of applying the drive pulse signal repetitively is $3.6 \times 10^8$, and a decreasing rate of the deformation amount when the voltage is applied to the piezoelectric film is measured after the drive pulse signal is applied repetitively, the fatigue phenomenon of the deformation amount decreasing to less than 97% of the deformation amount before the drive pulse signal is applied repetitively occurs.

That is, even when the polarization direction in the piezoelectric film is aligned by the aging process according to the related art, the polarization state of the piezoelectric film may be gradually collapsed over time. As a result, the deformation amount (surface displacement amount) of the piezoelectric film at the time of actual driving of the electromechanical transducer may decrease over time.

Accordingly, the present inventors have conducted studies and experiments zealously, with respect to the temporal decrease of the deformation amount of the piezoelectric film and have found that the temporal decrease of the deformation amount of the piezoelectric film can be suppressed by executing the polarization process, such that a hysteresis characteristic of the piezoelectric film becomes a predetermined characteristic. In detail, the present inventors have found that the temporal decrease of the deformation amount of the piezoelectric film can be suppressed by executing the polarization process, such that a hysteresis characteristic of the piezoelectric film becomes a characteristic shifted to a minus side by a predetermined amount, on the exterior.

As a mechanism for suppressing the temporal decrease of the deformation amount of the piezoelectric film, lattice defects (lattice vacancies) having effective charges in piezoelectric material crystal in a piezoelectric film to be described below are considered.

FIG. 1 is a perspective view schematically illustrating 2×2×2 cells of a crystal lattice of lead zirconate titanate (PZT) to be an example of a piezoelectric material. As illustrated in FIG. 1, PZT crystal has a structure in which lead tetrahedrons where a lead (Pb) atom is positioned at a vertex and oxygen octahedrons where an oxygen atom is positioned at a vertex are regularly arranged. At the center of the oxygen octahedron, a zirconium (Zr) atom or a titanium (Ti) atom is positioned. In the PZT crystal, lattice vacancies ($V_O$) of oxygen having effective charges having a valence of $2^+$ or lattice vacancies ($V_{Pb}$) of lead having effective charges having a valence of $2^-$ exists.

Figure 2:
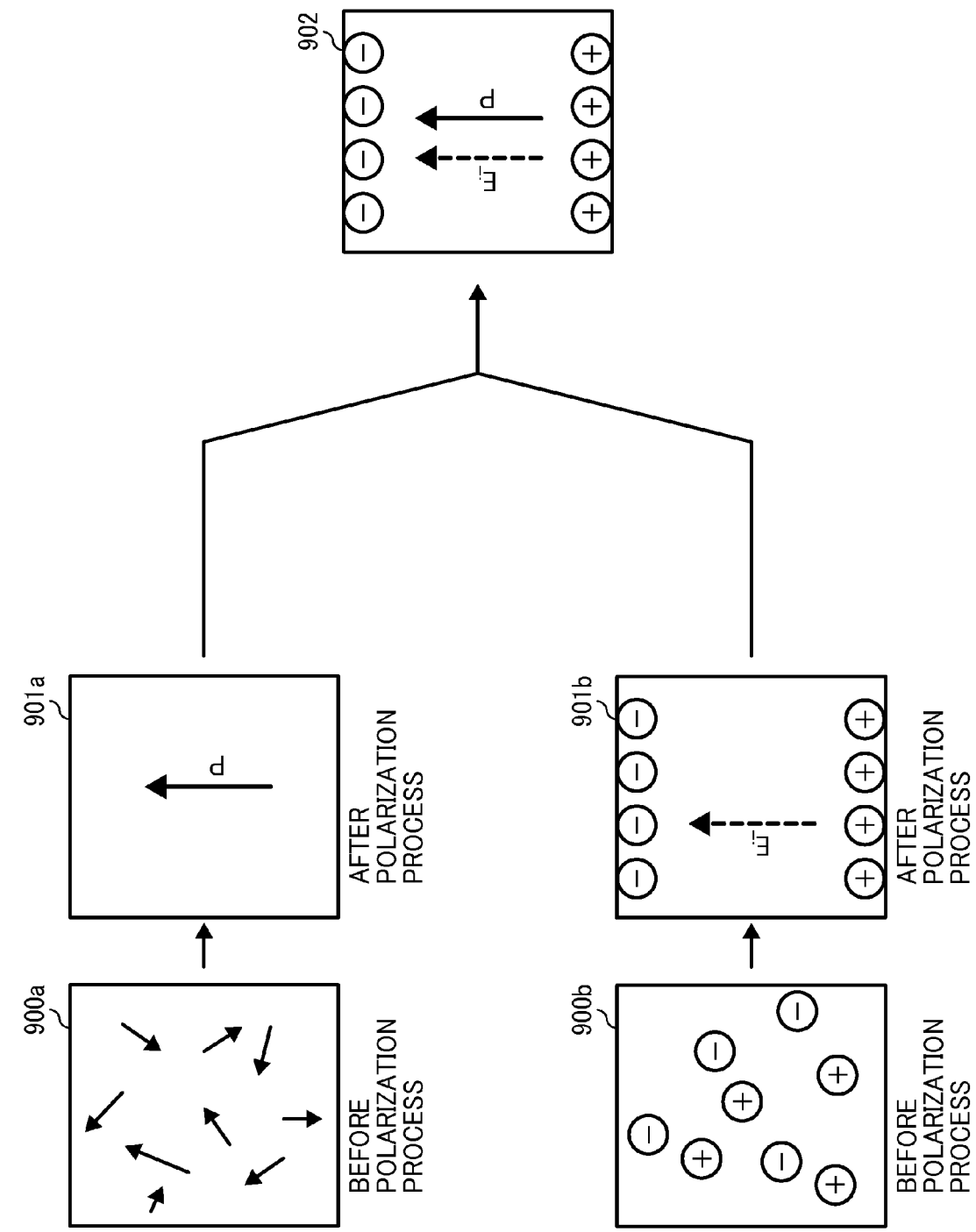
FIG. 2 is a diagram illustrating a polarization state change when a polarization process of a piezoelectric film having lattice defects (lattice vacancies)

FIG. 2 is a diagram illustrating a polarization state change when a polarization process of the piezoelectric film having the lattice defects (the lattice vacancies) is executed. In FIG. 2, each of areas 900a, 900b, 901a, 901b, and 902 surrounded with squares shows a part of the piezoelectric film and a vertical direction is a thickness direction of the piezoelectric film. In addition, in FIG. 2, a solid arrow shows a direction of the polarization axis (the electric dipole moment by the ion displacement) of the domain configuring the piezoelectric material crystal and circles including a plus symbol and a minus symbol in the areas 900b, 901b, and 902 show lattice defects (lattice vacancies) having plus and minus effective charges, respectively. In addition, FIG. 2, a solid arrow and a dashed arrow shown by thick lines show polarization P by the electric dipole moment and an internal field Ei by the lattice defects (lattice vacancies) arranged in on an end of a film thickness direction, respectively. In addition, in an example of FIG. 2, an upper side is a plus side in a voltage applied by the polarization process and a direction of an external field is a downward direction.

In the piezoelectric crystal before the polarization process, as shown in the areas 900a and 900b of FIG. 2, a direction of the polarization axis is a random direction and the lattice defects (lattice vacancies) having the plus and minus effective charges also exist randomly. If the polarization process is executed on the piezoelectric material crystal under a predetermined condition to be described below, as shown in the area 901a of FIG. 2, the direction of the polarization axis is aligned to the same direction (an upward direction). In addition, as shown in the area 901b of FIG. 2, the lattice defects (lattice vacancies) existing in the piezoelectric material crystal move to be arranged in both ends of the film thickness direction according to the external field of the polarization process and the internal field Ei is generated by the charges of the lattice defects (lattice vacancies) arranged in each end. In addition, as shown in the area 902 of FIG. 2, the direction of the polarization axis is arranged to the same direction and the internal field Ei is generated by movement of the lattice defects (lattice vacancies) to both ends, so that the polarization state of the piezoelectric film is stabilized. Thereby, the temporal change of the deformation amount of the piezoelectric film can be suppressed.

In addition, the present inventors have found that existence of the internal field Ei considered as a factor contributing to suppression of the temporal decrease of the deformation amount of the piezoelectric film appears as the phenomenon of the hysteresis characteristic of the piezoelectric film becoming the characteristic shifted to the minus side on the exterior.

In the method of manufacturing the electromechanical transducer according to this embodiment, the polarization process of the piezoelectric film is executed such that a predetermined hysteresis characteristic to be described below is obtained, on the basis of the result of the experiments conducted by the present inventors. In the following description, the method of manufacturing the electromechanical transducer includes at least four steps to be described below.

(1) Step of forming a first electrode on a substrate or a base film (2) Step of forming a piezoelectric film on the first electrode (3) Step of forming a second electrode on the piezoelectric film (4) Step of executing a polarization process on the piezoelectric film The polarization process is a process for applying a positive polarity voltage to generate a field to strengthen spontaneous polarization of a direction parallel to a thickness direction of the piezoelectric film or a negative polarity voltage having a polarity opposite to the positive polarity voltage between the first electrode and the second electrode. Here, the "positive polarity voltage" and the "negative polarity voltage" are voltages applied to the second electrode, using a potential of the first electrode as a GND potential (zero potential).

When the polarization process to apply the positive polarity voltage is executed, the polarization process is executed under a condition in which a hysteresis characteristic satisfying the following expressions [1] and [2] is obtained.

$$-Ec^P-(-Ec)<0 \qquad \text{[Expression 1]}$$

$$|-Ec^P-(-Ec)|>0.15 \times Ec^{Pav} \qquad \text{[Expression 2]}$$

Here, "−Ec" shows an initial coercive field of the negative polarity side of the electromechanical transducer. In addition, "$-Ec^P$" and "$Ec^P$" show a coercive field of the negative polarity side and a coercive field of the positive polarity side after the polarization process to apply the voltage of the positive polarity is executed, respectively. In addition, "$Ec^{Pav}$" shows an average ($=(|-Ec^P|+Ec^P)/2$) of absolute values of the coercive field $-Ec^P$ and the coercive field $Ec^P$.

In order to obtain a superior effect of the polarization process, the polarization process is executed under a condition in which a hysteresis characteristic satisfying the following expressions [3] and [4] is obtained.

$$-Ec^P-(-Ec)<0 \qquad \text{[Expression 3]}$$

$$|-Ec^P-(-Ec)|>0.26 \times Ec^{Pav} \qquad \text{[Expression 4]}$$

The polarization process is executed under the condition in which the predetermined hysteresis characteristic is obtained and the internal field Ei by the lattice defects (lattice vacancies) is generated in the piezoelectric film, so that the polarization state of the piezoelectric film can be stabilized and the temporal decrease of the deformation amount of the piezoelectric film can be surely suppressed.

Figure 3:
FIG. 3 is a cross-sectional view illustrating an example of a schematic configuration of an electromechanical transducer according to an embodiment of the present disclosure.
Figure 4:
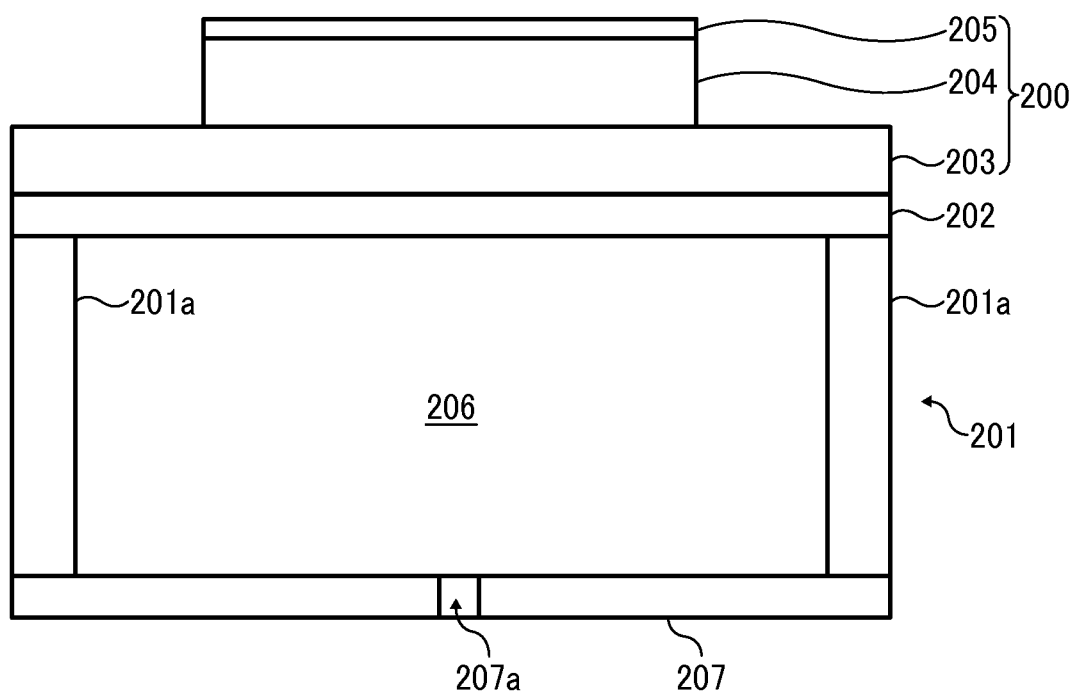
FIG. 4 is a cross-sectional view illustrating an example of a schematic configuration of a main portion of a single nozzle type droplet discharge head including the electromechanical transducer.
Figure 5:
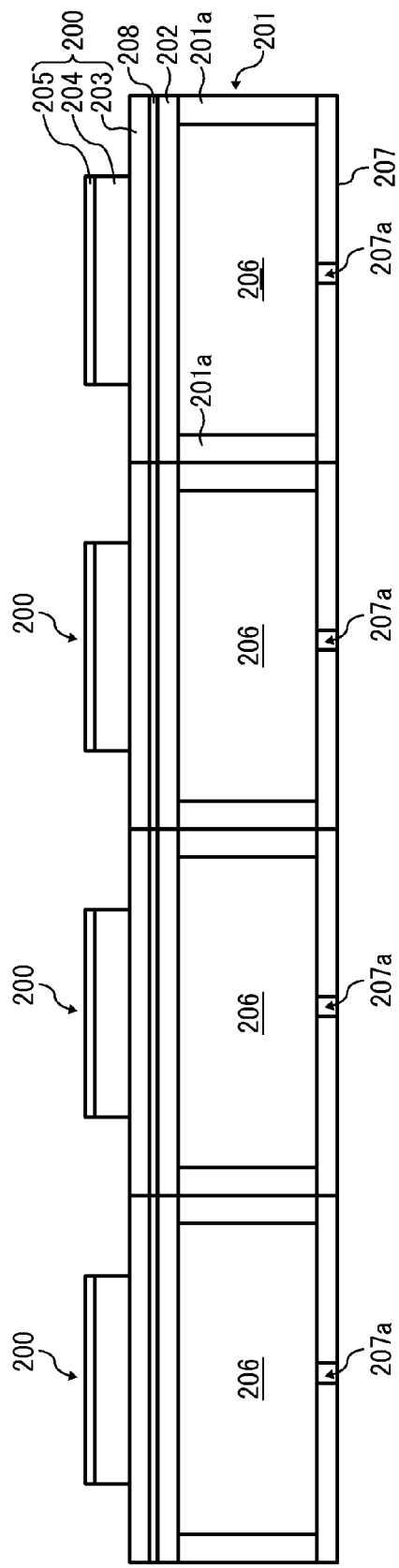
FIG. 5 is a cross-sectional view illustrating an example of a schematic configuration of a main portion of a multiple nozzle type droplet discharge head including the electromechanical transducer.

Next, an electromechanical transducer and a manufacturing method thereof according to an embodiment will be described. FIG. 3 is a cross-sectional view illustrating an example of a schematic configuration of an electromechanical transducer according to an embodiment of the present disclosure. FIG. 4 is a cross-sectional view illustrating an example of a schematic configuration of a main portion of a single nozzle type droplet discharge head including the electromechanical transducer. FIG. 5 is a cross-sectional view illustrating an example of a schematic configuration of a main portion of a multiple nozzle type droplet discharge head including the electromechanical transducer.

As illustrated in FIG. 3, an electromechanical transducer 200 according to the embodiment includes a first electrode (lower electrode) 203, a piezoelectric film 204 functioning as an electromechanical transduction film, and a second electrode (upper electrode) 205. A diaphragm 202 to be a base film is formed in a substrate 201 and the electromechanical transducer 200 is provided on a surface of the diaphragm 202 opposite to the side of the substrate 201. As illustrated in FIG. 5, in some embodiments, an adhesion layer 208 is disposed between the first electrode 203 and the diaphragm 202 of the electromechanical transducer 200 to increase adhesion between the first electrode 203 and the diaphragm 202.

As illustrated in FIGS. 4 and 5, a liquid chamber (pressure chamber) 206 is provided in a portion of the substrate 201 facing the electromechanical transducer 200. In addition, a nozzle plate 207 in which a nozzle 207a communicating with the liquid chamber 206 is formed is provided on a surface of the substrate 201 opposite to the side of the diaphragm 202.

As the substrate 201, a silicon single crystal substrate is preferably used. The substrate 201 preferably has a thickness of 100 to 600 [µm]. As plane orientations of the substrate 201, three kinds of (100), (110), and (111) are known. However, (100) and (111) are generally used widely in the semiconductor industry. In the configuration of this embodiment, a single crystal substrate having a plane orientation of (100) is mainly used.

When the liquid chamber 206 illustrated in FIG. 4 is manufactured, the silicon single crystal substrate is processed using etching. In this case, anisotropic etching is generally used as an etching method. The anisotropic etching uses the property that an etching rate is different for each plane orientation of a crystal structure. For example, in the anisotropic etching immersed in an alkaline solution such as KOH, an etching rate of a (111) plane becomes about 1/400 of an etching rate of a (100) plane. Therefore, a structure having an inclination of about 54° can be manufactured in the plane orientation (100), but a deep groove can be formed in the plane orientation (110). For this reason, an array density can be increased while rigidity is maintained. In consideration of the above point, a single crystal substrate having the plane orientation of (110) can be used as the configuration of this embodiment. In this case, however, because $SiO_2$ to be a mask material may also be etched, the single crystal substrate having the plane orientation of (110) is used in consideration of the above point.

The diaphragm 202 is deformed (surface displacement) by force generated by the electromechanical transducer 200 and discharges a liquid of the liquid chamber 206 as droplets. For this reason, a component having predetermined strength is preferably used as a base of the electromechanical transducer 200. As materials of the diaphragm 202, materials manufactured using Si, $SiO_2$, and $Si_3N_4$ and a chemical vapor deposition (CVD) method are exemplified.

In addition, materials of which linear expansion coefficients are close to linear expansion coefficients of the first electrode 203 and the piezoelectric film 204 are preferably selected as materials of the diaphragm 202. Particularly, when lead zirconate titanate (PZT) is used as the material of the piezoelectric film 204, materials having linear expansion coefficients of $5 \times 10^{-6}$ [1/K] to $10 \times 10^{-6}$ [1/K] close to $8 \times 10^{-6}$ [1/K] to be a linear expansion coefficient of the PZT are preferably used as the materials of the diaphragm 202. In addition, materials having linear expansion coefficients of $7 \times 10^{-6}$ [1/K] to $9 \times 10^{-6}$ [1/K] are preferably used as the materials of the diaphragm 202.

As specific materials of the diaphragm 202, aluminum oxide, zirconium oxide, iridium oxide, ruthenium oxide, tantalum oxide, hafnium oxide, osmium oxide, rhenium oxide, rhodium oxide, palladium oxide, and compounds thereof can be exemplified. A film of these materials is formed by a spin coater using a sputtering method or a chemical solution deposition (CSD) method, so that the diaphragm 202 can be manufactured.

A film thickness of the diaphragm 202 is preferably 0.1 [µm] to 10 [µm], more preferably 0.5 [µm] to 3 [µm]. If the film thickness is smaller than a film thickness in the above range, it becomes difficult to process the liquid chamber (pressure chamber) 206 illustrated in FIG. 4. If the film thickness is larger than the film thickness in the above range, the diaphragm 202 becomes hard to perform deformation (surface displacement) and the discharge of the droplets becomes unstable.

As metal materials of the first electrode 203 and the second electrode 205, platinum having high heat resistance and high reactivity is used conventionally. However, the platinum does not have a sufficient barrier property for the lead of the PZT. For this reason, platinum group elements such as iridium and platinum-rhodium or alloy films thereof may be used as the materials of the first electrode 203 and the second electrode 205. In addition, an adhesion layer such as Ti, $TiO_2$, Ta, $Ta_2O_5$, and $Ta_3N_5$ is previously stacked, because adhesion with a base (in particular, $SiO_2$) is bad, when the platinum is used. As a method of manufacturing the first electrode 203 and the second electrode 205, vacuum film formation such as a sputtering method or a vacuum vapor deposition method is generally used. A film thickness is preferably 0.05 [µm] to 1 [µm], more preferably 0.1 [µm] to 0.5 [µm]. When the PZT is selected as the material of the piezoelectric film 204, a film in which a crystal plane effective for an electromechanical transduction function is preferentially oriented as crystallinity is preferable. For this reason, an electrode film affecting preferential orientation in a film arranged on an upper layer is preferably selected as the material of the first electrode (lower electrode) 203.

From the concept for a temporal fatigue characteristic of the deformation (surface displacement) of the piezoelectric film 204, a conductive oxide such as strontium ruthenate may be stacked as an electrode portion. That is, the conductive oxide such as the strontium ruthenate may be stacked between the first electrode 203 and the piezoelectric film 204 and between the piezoelectric film 204 and the second electrode 205. When the conductive oxide is stacked, the temporal decrease of the deformation (surface displacement) of the piezoelectric film 204 can be alleviated.

As the piezoelectric film 204, a material using lead zirconate titanate (PZT) as a main component is used. The PZT is a solid solution of lead zirconate ($PbTiO_3$) and titanium acid ($PbTiO_3$) and has a characteristic different according to a ratio of the lead zirconate ($PbTiO_3$) and the titanium acid ($PbTiO_3$). In a composition showing a generally superior piezoelectric characteristic, a ratio of $PbZrO_3$ and $PbTiO_3$ is 53:47. If the composition is represented by a chemical formula, the composition is represented by Pb$(Zr_{0.53}Ti_{0.47})$ $O_3$, generally, PZT (53/47). As a composite oxide other than the PZT, barium titanate is exemplified. In this case, barium alkoxide and titanium alkoxide compounds are used as a starting material and are dissolved in a common solvent, so that a barium titanate precursor solution can be produced. This material is represented by a general formula $ABO_3$ and a composite oxide using A=Pb, Ba, and Sr and B=Ti, Zr, Sn, Ni, Zn, Mg, and Nb as main components corresponds to the material. Chemical formulas of the composite oxide are represented by $(Pb_{1-x}, Ba_x)$ (Zr, Ti) $O_3$ or (Pb) $(Zr_x, Ti_y, Nb_{1-x-y})O_3$, specifically. The chemical formulas show chemical formulas when a part of Pb of the A site is substituted with Ba and a part of Zr and Ti of the B site is substituted with Nb. The substitution is carried out by material reforming for the application of a deformation characteristic (displacement characteristic) of the PZT.

As a method of manufacturing the piezoelectric film 204, a method such as spin coat film formation using a sputtering method, a CVD method, or a CSD method can be used. When the above method is used, patterning is necessary. For this reason, a desired pattern is obtained by photolithoetching.

When the PZT film is manufactured as the piezoelectric film 204 using the CSD method, lead acetate, zirconium alkoxide, and titanium alkoxide compounds are used as starting materials and are dissolved in methoxyethanol functioning as a common solvent. Thereby, a uniform PZT precursor solution can be produced. Because a metal alkoxide compound is hydrolyzed by atmospheric water easily, acetylacetone, acetic acid, diethanolamine functioning as stabilizers may be appropriately added to the PZT precursor solution.

When the PZT film is obtained on an entire surface of the substrate or the base film, the PZT film is obtained by forming a coating film by a solution coating method such as a spin coat method and performing each heat treatment of solvent drying, thermal decomposition, and crystallization. Because transformation from the coating film to the crystalline film causes volume contraction, a concentration of the PZT precursor solution needs to be adjusted to obtain a film thickness of 100 [nm] or less by one process in order to obtain a crack-free film A film thickness of the piezoelectric film 204 is preferably in a range of 0.5 [μm] to 5 [μm] and is more preferably in a range of 1 [μm] to 2 [μm]. If the film thickness is smaller than a film thickness in the above range, sufficient deformation of the piezoelectric film cannot be performed (the surface displacement cannot be generated) and if the film thickness is larger than the film thickness in the above range, the number of processes increases to stack any layer and a process time increases.

A characteristic of the piezoelectric material configuring the piezoelectric film 204 can be evaluated from measurement of a P-E hysteresis loop curved line (hereinafter, referred to as a "P-E curved line"). Here, P shows polarization (unit: μC/cm$^2$) and E shows field strength (unit: kV/cm).

Figure 6A:
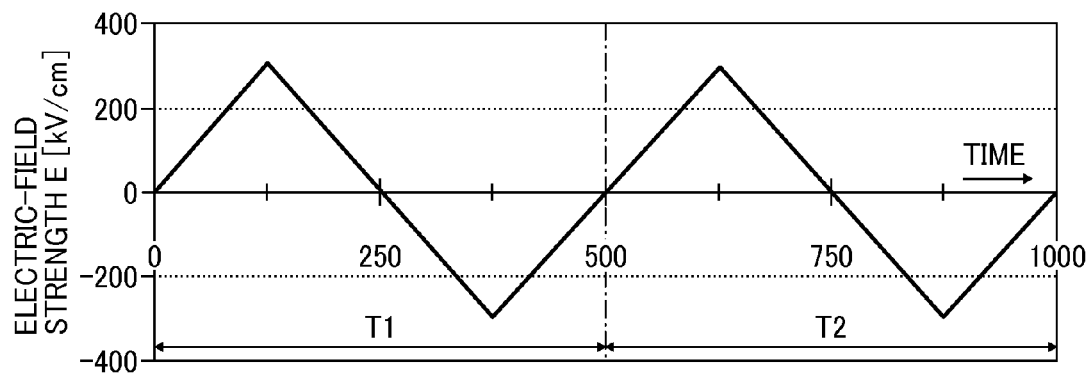
FIGS. 6A and 6B are graphs illustrating examples of an application field waveform and a polarization response waveform when a P-E curved line of a measurement sample of an electromechanical transducer is measured, respectively.
Figure 6B:
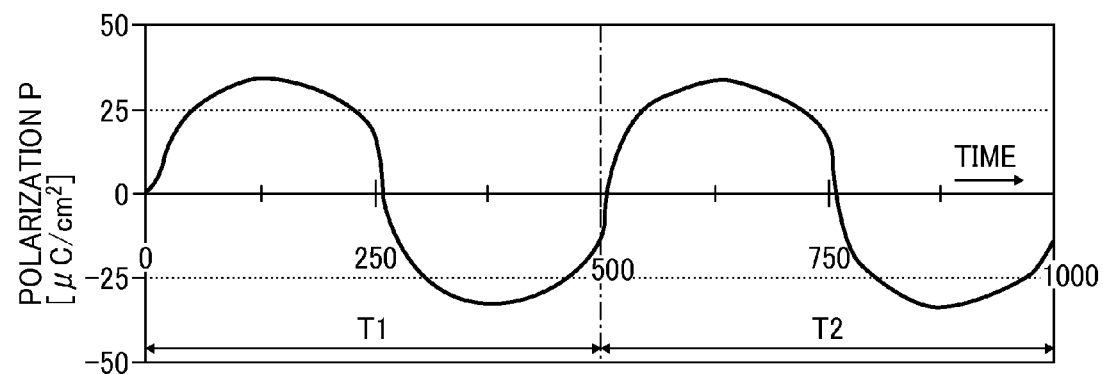

FIGS. 6A and 6B are graphs illustrating examples of an application field waveform and a polarization response waveform when a P-E curved line of a measurement sample of the electromechanical transducer 200 is measured, respectively. In the examples illustrated in FIGS. 6A and 6B, a field of a triangular wave of which a frequency is 100 [Hz] is applied to the piezoelectric film 204 of the measurement sample by two cycles. A sampling frequency is 500 [p/cycle]. In addition, in FIGS. 6A and 6B, T1 and T2 show a first cycle and a second cycle of the field application, respectively.

Figure 7A:
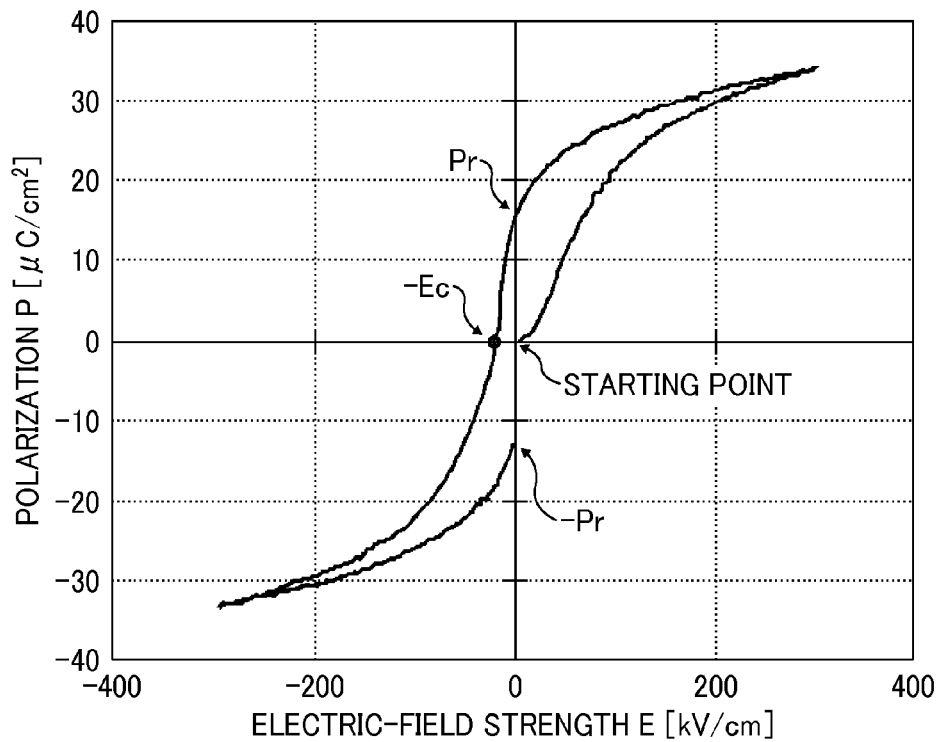
FIGS. 7A and 7B are graphs illustrating examples of P-E curved lines at a first cycle T1 and a second cycle T2 of field application before a polarization process, respectively.
Figure 7B:
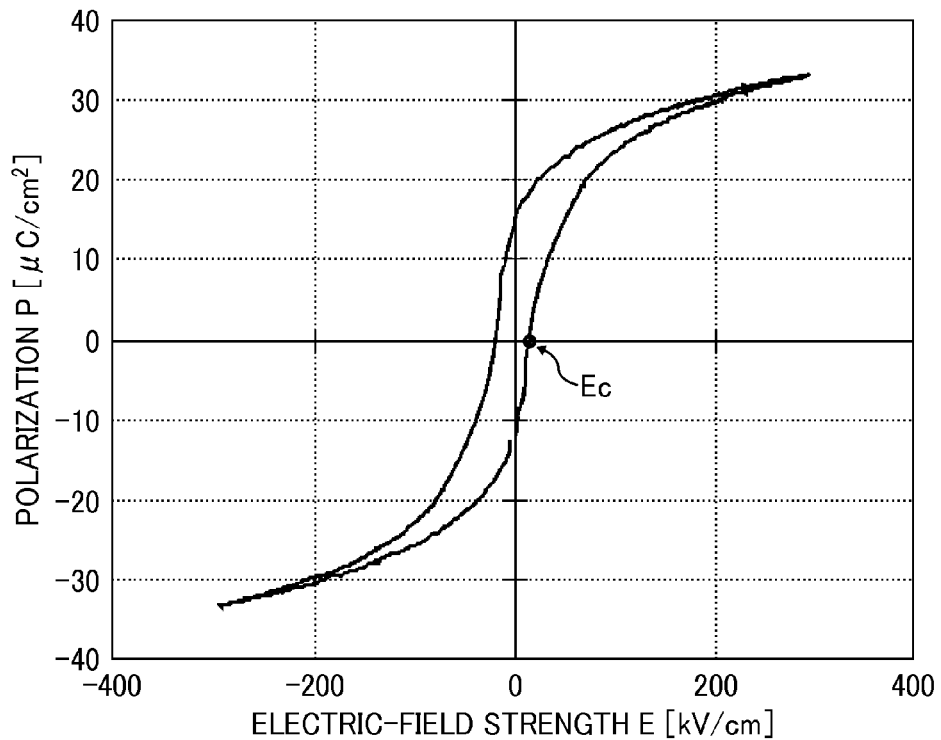

FIGS. 7A and 7B are graphs illustrating examples of P-E curved lines at a first cycle T1 and a second cycle T2 of field application before a polarization process, respectively. At the first cycle T1 of the field application, as illustrated in FIG. 7A, when the first field is applied to the piezoelectric film 204 of the measurement sample, a polarization value starts from an original point (starting point in FIG. 7A) and the polarization value is maximized by a positive polarity maximum application field (300 [kV/cm]). In addition, residual polarization (+Pr) is shown at field strength 0 [kV/cm]. In this case, if the negative polarity field strength increases, the polarization value becomes 0 [μC/cm$^2$] and field strength at that time is called coercive field (−Ec). Then, if the field strength is set to 0 [kV/cm] again via a negative maximum field strength, the polarization value has the residual polarization (−Pr) and does not return to the original point.

In addition, at the second cycle T2 of the field application, as illustrated in FIG. 7B, when the field strength increases from a point of the residual polarization (−Pr), the polarization value becomes 0 [μC/cm$^2$] and field strength at that time is called coercive field (Ec). If the field strength increases, the polarization value is maximized by the positive polarity maximum application field (300 [kV/cm]). In addition, the residual polarization is shown at the field strength 0 [kV/cm]. In this case, if the negative polarity field strength increases, the polarization value becomes 0 [μC/cm$^2$]. Then, if the field strength is set to 0 [kV/cm] again via the negative maximum field strength, the polarization value has the residual polarization.

Figure 8A:
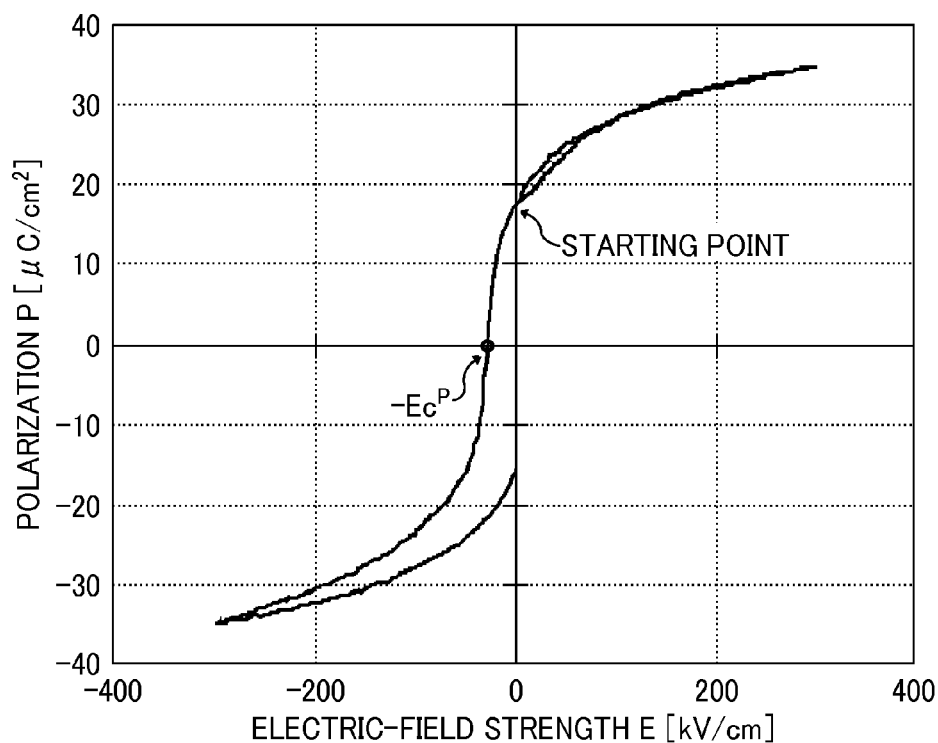
FIGS. 8A and 8B are graphs illustrating examples of P-E curved lines at a first cycle T1 and a second cycle T2 of field application after a positive polarity polarization process, respectively.
Figure 8B:
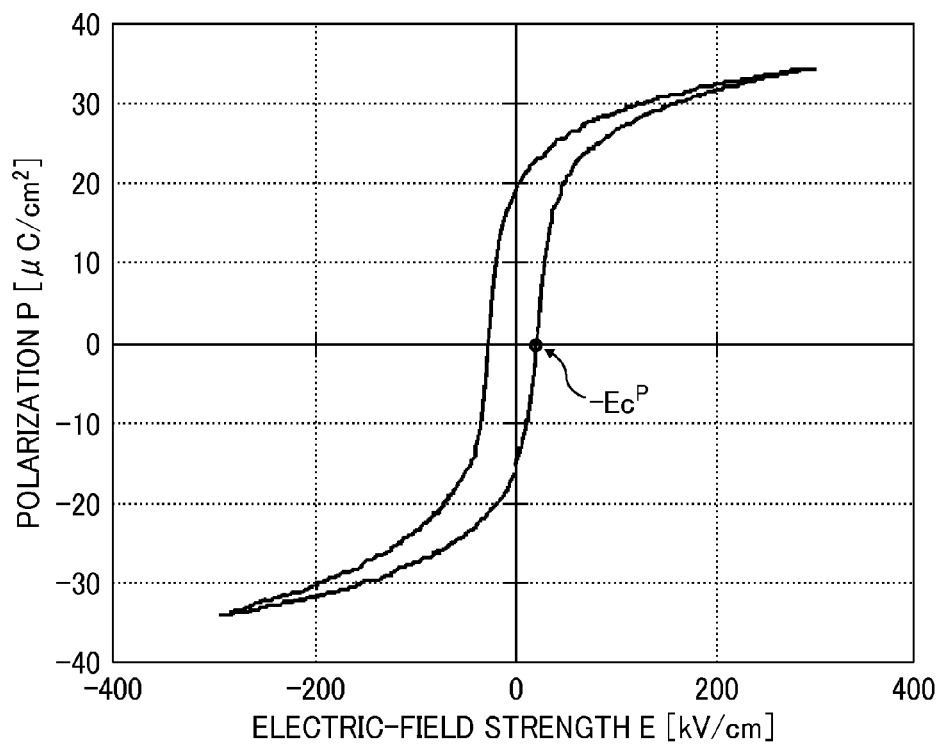
Figure 9A:
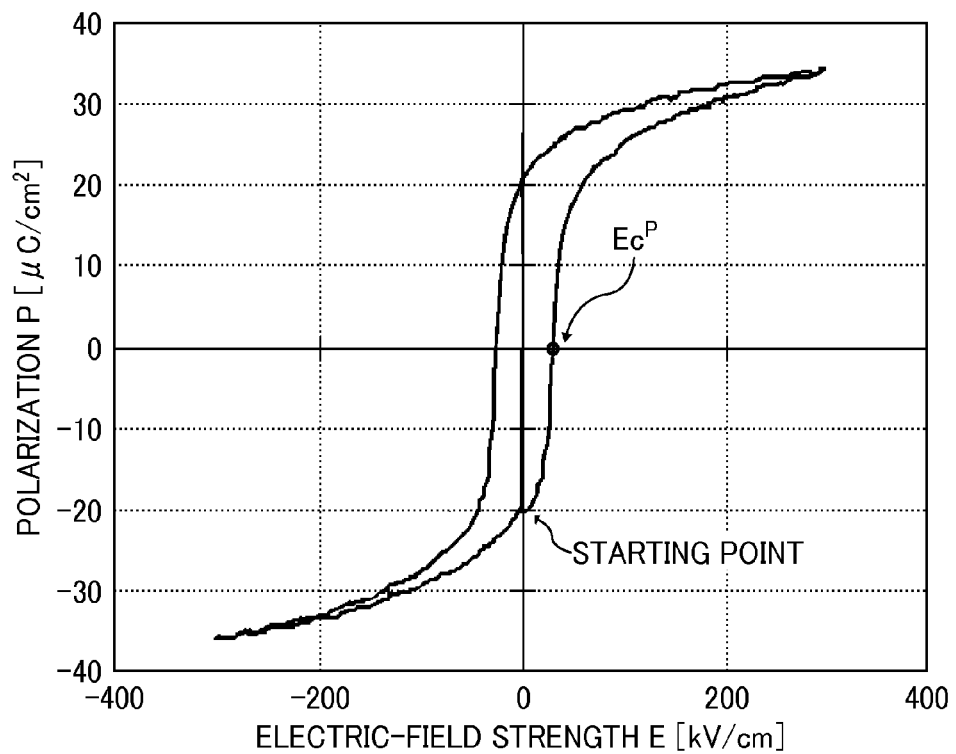
FIGS. 9A and 9B are graphs illustrating examples of P-E curved lines at a first cycle T1 and a second cycle T2 of field application after a negative polarity polarization process, respectively.
Figure 9B:
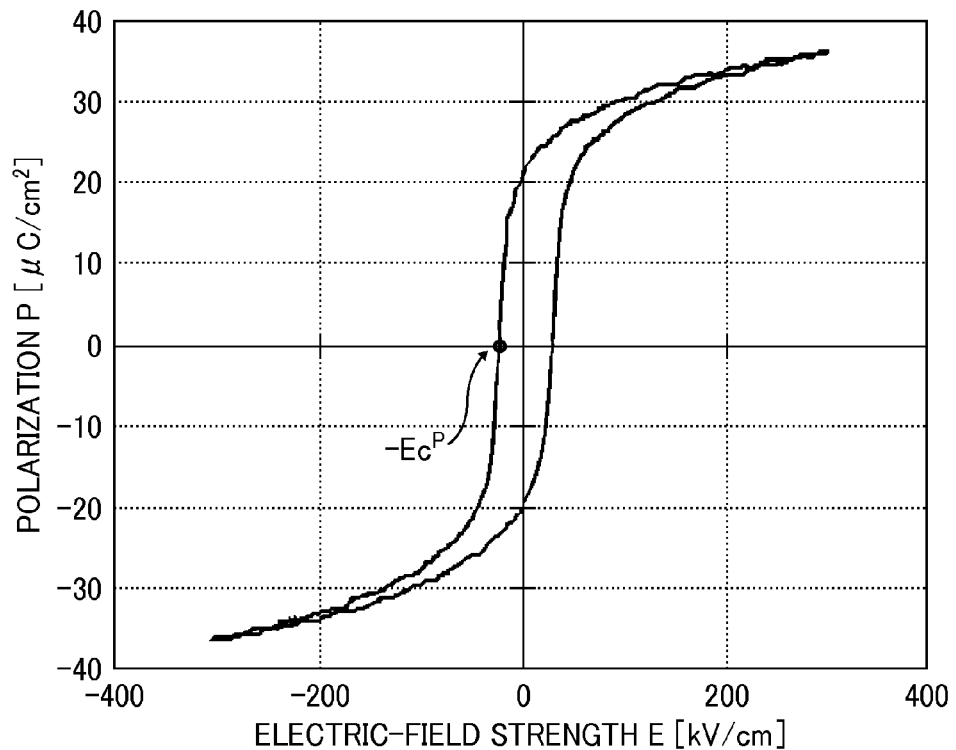

FIGS. 8A and 8B are graphs illustrating examples of P-E curved lines at a first cycle T1 and a second cycle T2 of field application after a positive polarity polarization process, respectively. In addition, FIGS. 9A and 9B are graphs illustrating examples of P-E curved lines at a first cycle T1 and a second cycle T2 of field application after a negative polarity polarization process, respectively.

As illustrated in FIGS. 8A to 9B, in this embodiment, the coercive field after the polarization process is represented as follows. In the P-E curved line measurement (bipolar field application cycle) after the positive polarity polarization process in FIGS. 8A and 8B, the negative polarity coercive field at the first cycle T1 is represented as $[-Ec^P]$ and the positive polarity coercive field at the second cycle T2 is represented as $[Ec^P]$. In addition, in the P-E curved line measurement (bipolar field application cycle) after the negative polarity polarization process in FIGS. 9A and 9B, the positive polarity coercive field at the first cycle T1 is represented as $[Ec^P]$ and the negative polarity coercive field at the second cycle T2 is represented as $[-Ec^P]$.

In addition, a shift amount of the negative polarity coercive field and a shift amount of the positive polarity coercive field before and after the polarization process are defined by the following expressions (5) and (6), respectively.

$$|-Ec^P-(-Ec)| \qquad \text{[Expression 5]}$$

$$(Ec^P-Ec) \qquad \text{[Expression 6]}$$

In addition, an average $Ec^{Pav}$ of absolute values of the coercive field $Ec^P$ and the coercive field $-Ec^P$ after the polarization process is defined by the following expression (7).

$$Ec^{Pav}=(|-Ec^P|+Ec^P)/2 \qquad \text{[Expression 7]}$$

Figure 10:
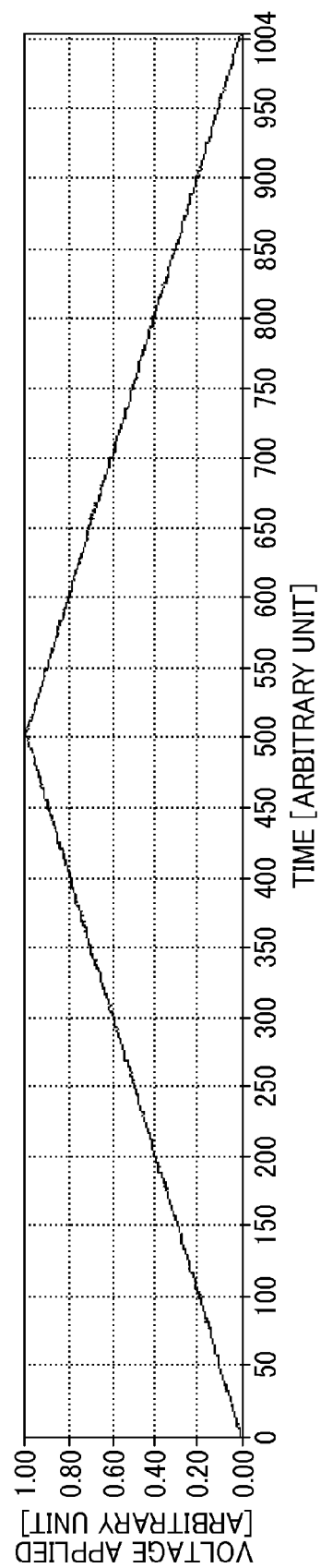
FIG. 10 is a graph illustrating an example of a polarization process signal used for a polarization process of a piezoelectric film of an electromechanical transducer.

FIG. 10 is a graph illustrating an example of a polarization process signal used for the polarization process of the piezoelectric film 204 of the electromechanical transducer 200. The example of FIG. 10 is an example of a polarization process signal to apply a single polarity field (unipolar field) of a triangular wave of which a frequency is 0.05 [Hz]. The repetition number of times is one. The application field depends on a sample film thickness (film thickness of the piezoelectric film 204). As the application voltage, a voltage of a triangular wave of which a minimum value Vmin is 0 [V] and a maximum value Vmax is 50 to 150 [V] is applied.

Figure 11:
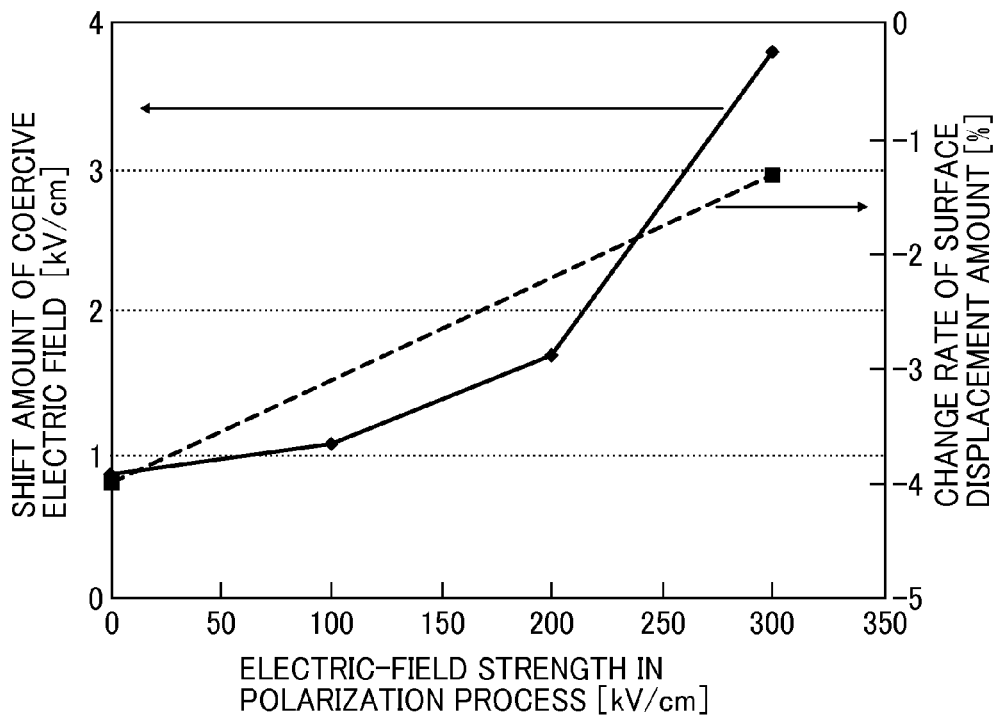
FIG. 11 is a graph illustrating an example of a relation of field strength at the time of a polarization process and temporal change rates of a shift amount of a coercive field and a surface displacement amount of an electromechanical transducer.

FIG. 11 is a graph illustrating an example of a relation of field strength [kV/cm] when a polarization process based on noiinal DC bias application is executed and temporal change rates [%] of a shift amount [kV/cm] of the coercive field and the surface displacement amount of the electromechanical transducer 200. The shift amount [kV/cm] of the coercive field is calculated by the expression (5) or (6) described above. As a surface displacement amount of the electromechanical transducer 200, a surface displacement amount of the diaphragm 202 formed on the side of a bottom surface of the first electrode (lower electrode) 203 of the electromechanical transducer 200 is measured. The diaphragm 202 and a manufacturing method thereof are the same as those in an example 1 to be described below. A temporal change rate

[%] of the surface displacement amount is a value obtained by calculating a difference of an initial surface displacement amount after the polarization process and a surface displacement amount after the electromechanical transducer 200 is driven 360 million times, when the initial surface displacement amount is set to 100 [%]. A drive frequency at the time of driving the electromechanical transducer 200 is 100 [kHz] and the number of times of driving of 360 million correspond to the number of times of driving for one hour.

As illustrated in FIG. 11, when the application voltage at the time of the polarization process, that is, the field strength [kV/cm] increases, the shift amount of the coercive field increases and the temporal change rate of the surface displacement amount of the electromechanical transducer decreases. As performance assurance of the electromechanical transducer (actuator), in order to achieve the change rate of the surface displacement amount after driving the electromechanical transducer 10 billion times to be maintained within 5 [%], 150 [V] or more is required as the application voltage at the time of the polarization process. That is, if the film thickness of the piezoelectric film is 2 [μm], 800[kV/cm] or more is required by field strength conversion. However, when the polarization process is executed at the high field strength, breakdown may occur.

Figure 12:
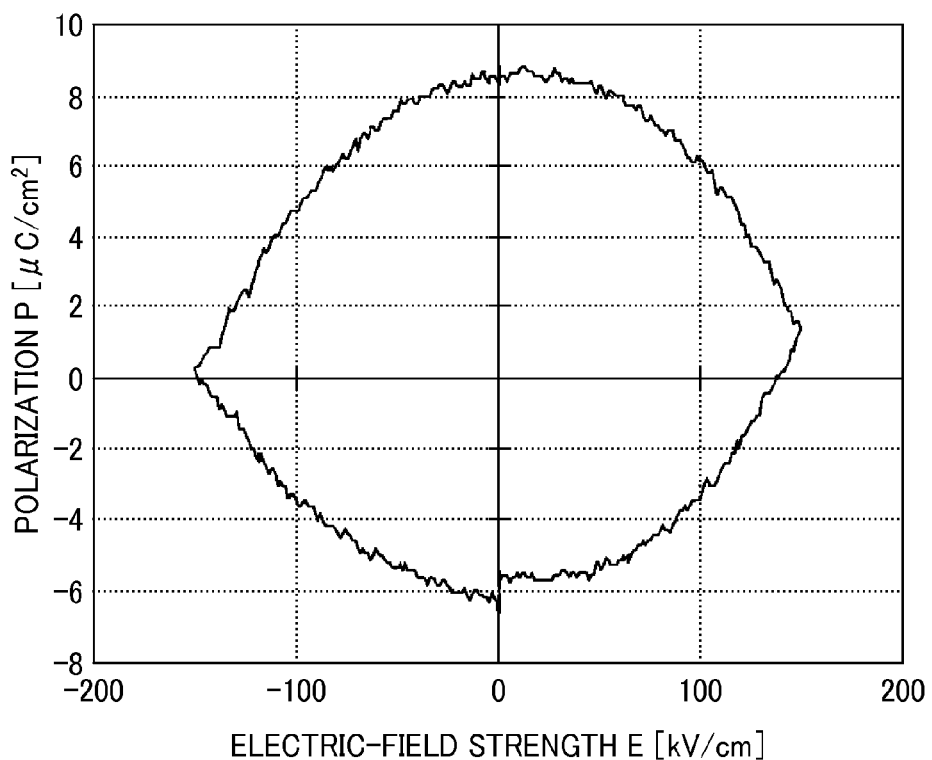
FIG. 12 is a graph illustrating an example of a P-E curved line after a polarization process is executed at an application field 400 [kV/cm] and breakdown occurs.

FIG. 12 is a graph illustrating an example of a P-E curved line after a polarization process is executed at an application field 400 [kV/cm] and breakdown occurs. In the experiments conducted by the present inventors, an upper limit of an application field in the polarization process of DC bias application, that is, an upper limit of an application field in which the breakdown does not occur is 350 [kV/cm]. In addition, the present inventors have conducted the experiments and have found that a capacitor is connected in series to the electromechanical transducer using a circuit in which a direct-current power supply and the electromechanical transducer are connected in series by the capacitor and the DC bias is applied, thereby executing the polarization process at the high field strength while preventing the breakdown.

Hereinafter, specific examples 1 to 14 of the electromechanical transducer, the manufacturing method, and the evaluation result according to this embodiment will be described together with comparative examples 1 to 4.

EXAMPLES

In examples 1 to 14, after a thermal oxide film (film thickness [1 μm] is formed on a silicon wafer, a titanium oxide film (for example, a film thickness 50 [nm]) and a platinum film (for example, a film thickness 100 [nm]) functioning as a first electrode are sequentially formed by sputtering. The titanium oxide film has a function as an adhesion layer between the thermal oxide film and the platinum film. A heating temperature of a substrate 201 when a film is formed by sputtering is set to 550°.

Next, a solution mixed with a composition ratio of Pb:Zr:Ti=110:53:47 is prepared as a PZT precursor coating liquid used for manufacturing a piezoelectric film 204. As synthetic starting materials of this PZT precursor coating liquid, lead acetate trihydrate, titanium isopropoxide, and zirconium isopropoxide are used. Crystal water of lead acetate is dissolved in methoxyethanol and is then dehydrated. A quantity of lead is excessively large for a stoichiometric composition. This is to prevent a crystalline drop by so-called lead omission during heat treatment. The titanium isopropoxide and the zirconium isopropoxide are dissolved in methoxyethanol, an alcohol exchange reaction and an esterification reaction are advanced, a resultant is mixed with a methoxyethanol solution having dissolved the lead acetate, and the PZT precursor solution is synthesized. A concentration of the PZT in the PZT precursor solution is 0.5 [mol/l]. After a film is formed by a spin coat method using the PZT precursor solution, 120° drying→500° C. thermal decomposition is performed. After a thermal decomposition process is executed on a third layer, crystallization heat treatment (temperature of 750°) is executed by rapid thermal annealing (RTA). At this time, a film thickness of the PZT is 240 [nm]. This process is executed 8 times (corresponding to 24 layers), so that a PZT film having a film thickness of about 2 [μm] is obtained as the piezoelectric film 204.

Next, a platinum film (film thickness of 125 [nm]) functioning as a second electrode is formed by sputtering. A substrate temperature at the time of forming the film by sputtering is set to 300° C. Then, a film is formed by the spin coat method using a photoresist (TSMR8800) manufactured by TOKYO OHKA KOGYO, a resist pattern is formed by a photolithographic technique, and a pattern is manufactured using an ICP etching device (manufactured by SAMCO).

Then, the silicon substrate 201 is polished by a known technique to have a desired thickness t (for example, 80 [μm]) to form a liquid chamber 206. As a method of causing the silicon substrate 201 to have the desired thickness t, a method such as etching other than a polishing method may be used.

Next, a partition wall other than the liquid chamber 206 of the silicon substrate 201 is coated with a resist using a lithography method. Then, anisotropic wet etching is performed using an alkaline solution (KOH solution or tetramethylammonium hydroxide (TMAH) solution) and the liquid chamber 206 is formed. In this way, the electromechanical transducer 200 illustrated in FIG. 4 and a liquid discharge head configured from the electromechanical transducer are manufactured.

In the examples 1 to 14, after the liquid chamber 206 is formed, the polarization process based on the bias field application by the capacitor serial connection is executed, the polarization state is adjusted in a drive voltage direction, and the electromechanical transducer 200 is manufactured.

In the case of the capacitor serial connection, the application voltage is distributed with a ratio of capacitance of the piezoelectric element and a capacity of a capacitor. In this embodiment, a metalized polypropylene capacitor of which a capacity ratio is 50:1 (a capacity to be 50 times as large as a PZT capacity) is used.

In the examples 1 to 14, the polarization process is executed such that the piezoelectric film after the polarization process has a plurality of kinds of different polarization characteristics (hysteresis characteristics) satisfying the conditions of the expressions [1] and [2] described above. Specifically, the magnitude of the peak value of the triangular wave of the application voltage illustrated in FIG. 10 is changed and the polarization process is executed. For example, the maximum application field at the time of the polarization process is 800 [kV/cm] and a total of process time is 200 seconds.

Comparative Examples

In a comparative example 1, after the liquid chamber 206 is formed, the polarization process is not executed and the electromechanical transducer is manufactured. In addition, in comparative examples 2 to 4, after the liquid chamber 206 is formed, the field (300 [kV/cm]) equal to or higher than the coercive field is applied, the polarization process is executed, the polarization state of the piezoelectric film (PZT film) is adjusted in the direction of the drive voltage, and the electromechanical transducer is manufactured. In the examples 2 to 4, the polarization process is executed such that the piezoelectric film after the polarization process has a plurality of kinds of different polarization characteristics (hysteresis characteristics) satisfying the conditions of the expressions [1] and [2] described above.

By measuring the P-E curved line in the application field 150 [kV/cm] using the liquid discharge head in the examples 1 to 14 and the comparative examples 1 to 4, the shift amount of the coercive field of the piezoelectric film after the polarization process is evaluated. When the shift amount of the coercive field is measured, the measurement field starts from 0 [kV/cm], the field application to oscillate the positive and negative fields by the triangular wave repetitively changing in a cycle is repetitively executed two times by two cycles of the first cycle and the second cycle and the evaluation is performed.

For the examples 1 to 14 and the comparative examples 1 to 4, the temporal change of the surface displacement amount of the electromechanical transducer 200 at the application field 150 [kV/cm] is evaluated. The surface displacement amount to be the deformation amount of the electromechanical transducer is a displacement amount in a surface of the center of the electromechanical transducer 200 and is measured using a laser Doppler vibrometer.

In addition, the temporal change of the surface displacement amount of the electromechanical transducer is evaluated as follows. An absolute value of the surface displacement amount of the electromechanical transducer after the polarization process is set to 100%. Then, the temporal change is evaluated by a change rate [%] of the surface displacement amount after a predetermined drive pulse signal (drive field) is applied to the second electrode (upper electrode) 205 of the electromechanical transducer $3.6 \times 10^8$ times, for five hours. Then, the temporal change is evaluated by a change rate [%] of the surface displacement amount after the electromechanical transducer is left for 24 hours.

Figure 13A:
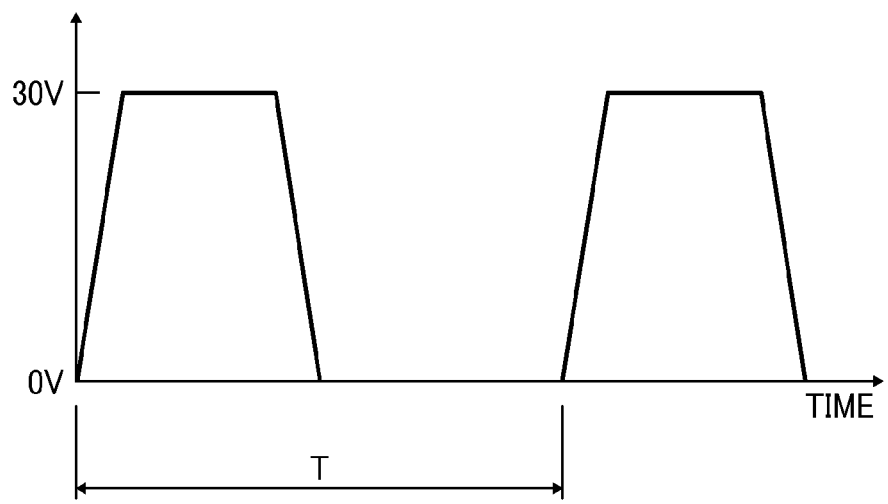
FIGS. 13A and 13B are diagrams illustrating two kinds of drive pulse signals A and B used for evaluating a change rate [%] of a surface displacement amount of an electromechanical transducer, respectively.
Figure 13B:
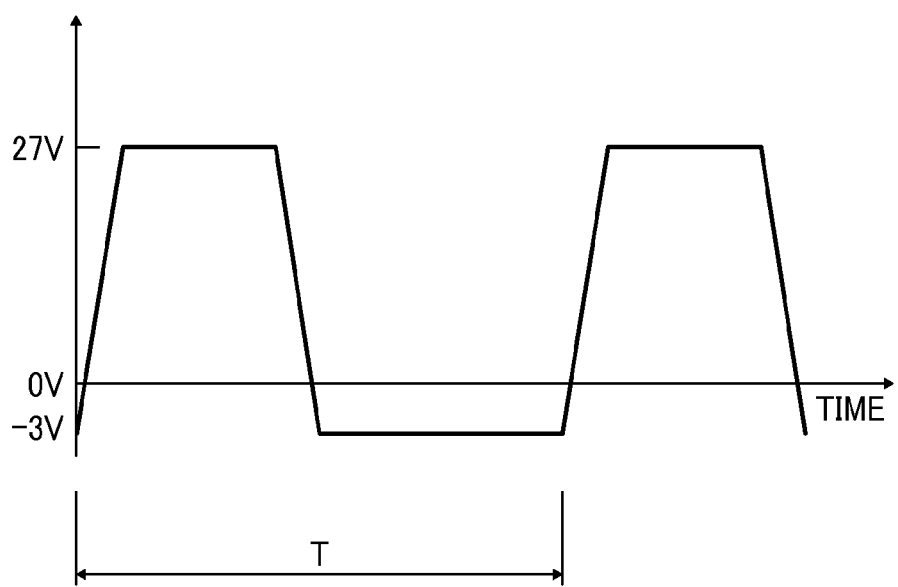

FIGS. 13A and 13B are diagrams illustrating two kinds of drive pulse signals A and B used for evaluating a change rate [%] of a surface displacement amount of the electromechanical transducer, respectively.

The drive pulse signal A of FIG. 13A is a pulse signal in which a minimum value is −0 [V] and a maximum value is +30 [V]. A cycle T of the drive pulse signal A is 50 [μsec] (a repetition frequency: 20 [kHz]), a duty ratio of the pulse is 50 [%], and rising and falling times are 1.6 [μsec].

The drive pulse signal B of FIG. 13B is a pulse signal in which a minimum value is −3 [V] and a maximum value is +27 [V]. A cycle T of the drive pulse signal B is 50 [μsec] (a repetition frequency: 20 [kHz]), a duty ratio of the pulse is 50 [%], and rising and falling times are 1.6 [μsec]. The drive pulse signal B is a drive pulse signal of minor loop drive in which a negative offset voltage is applied and a surface displacement amount larger than a surface displacement amount of the drive pulse signal A is applied. For this reason, the drive pulse signal B is a practically usable drive pulse signal that is preferable when high actuator performance is required. However, in the drive pulse signal B, a negative voltage in which a field accelerating depolarization, that is, a field of a direction opposite to a polarization direction is generated is applied. Thus, when the drive pulse signal B is applied repetitively, a temporal change of the surface displacement amount is easy to occur and the surface displacement amount after leaving is hard to be recovered. For this reason, it is necessary to more adjust the polarization process of the electromechanical transducer.

Tables 1-1, 1-2, and 1-3 (correctively referred to as Table 1) are tables illustrating a collection of a polarization characteristic (hysteresis characteristic) of the piezoelectric film after the polarization process, a measurement result of the temporal change rate of the surface displacement amount and a determination result thereof, and reference values A and B available for determination, in the examples 1 to 14 and the comparative examples 1 to 4.

TABLE 1-1

Polarization Characteristic (Hysteresis Characteristic) of Piezoelectric Film After Polarization Process

| | −Ec [V] | +Ec [V] | $-Ec^P$ [V] | $+Ec^P$ [V] | $-Ec^{Pav}$ [V] | $-Ec^P -$ (−Ec) [V] | $|-Ec^P -$ (−Ec)| [V] |
|---|---|---|---|---|---|---|---|
| Comparative Example 1 | −5 | 5 | −5.0 | 5.0 | 5.00 | 0.0 | 0.0 |
| Comparative Example 2 | −5 | 5 | −5.5 | 5.0 | 5.25 | −0.5 | 0.5 |
| Comparative Example 3 | −5 | 5 | −5.7 | 5.0 | 5.35 | −0.7 | 0.7 |
| Comparative Example 4 | −5 | 5 | −5.8 | 5.0 | 5.40 | −0.8 | 0.8 |
| Example 1 | −5 | 5 | −5.9 | 5.0 | 5.45 | −0.9 | 0.9 |
| Example 2 | −5 | 5 | −6.0 | 5.0 | 5.50 | −1.0 | 1.0 |
| Example 3 | −5 | 5 | −6.1 | 5.0 | 5.55 | −1.1 | 1.1 |
| Example 4 | −5 | 5 | −6.2 | 5.0 | 5.60 | −1.2 | 1.2 |
| Example 5 | −5 | 5 | −6.3 | 5.0 | 5.65 | −1.3 | 1.3 |
| Example 6 | −5 | 5 | −6.4 | 5.0 | 5.70 | −1.4 | 1.4 |
| Example 7 | −5 | 5 | −6.5 | 5.0 | 5.75 | −1.5 | 1.5 |
| Example 8 | −5 | 5 | −6.6 | 5.0 | 5.80 | −1.6 | 1.6 |
| Example 9 | −5 | 5 | −6.7 | 5.0 | 5.85 | −1.7 | 1.7 |
| Example 10 | −5 | 5 | −6.8 | 5.0 | 5.90 | −1.8 | 1.8 |
| Example 11 | −5 | 5 | −6.9 | 5.0 | 5.95 | −1.9 | 1.9 |
| Example 12 | −5 | 5 | −7.0 | 4.5 | 5.75 | −2.0 | 2.0 |
| Example 13 | −5 | 5 | −7.5 | 4.5 | 6.00 | −2.5 | 2.5 |
| Example 14 | −5 | 5 | −8.0 | 5.5 | 6.75 | −3.0 | 3.0 |

TABLE 1-2

Reference Value Usable For Determination

| | | Reference Value A $0.15Ec^{Pav}$ [V] | | Reference Value B $0.26Ec^{Pav}$ [V] |
|---|---|---|---|---|
| Comparative Example 1 | < | 0.75 | < | 1.30 |
| Comparative Example 2 | < | 0.79 | < | 1.37 |
| Comparative Example 3 | < | 0.80 | < | 1.39 |
| Comparative Example 4 | < | 0.81 | < | 1.40 |
| Example 1 | > | 0.82 | < | 1.42 |
| Example 2 | > | 0.83 | < | 1.43 |
| Example 3 | > | 0.83 | < | 1.44 |
| Example 4 | > | 0.84 | < | 1.46 |
| Example 5 | > | 0.85 | < | 1.47 |
| Example 6 | > | 0.86 | < | 1.48 |
| Example 7 | > | 0.86 | = | 1.50 |
| Example 8 | > | 0.87 | > | 1.51 |
| Example 9 | > | 0.88 | > | 1.52 |
| Example 10 | > | 0.89 | > | 1.53 |
| Example 11 | > | 0.89 | > | 1.55 |
| Example 12 | > | 0.86 | > | 1.50 |
| Example 13 | > | 0.90 | > | 1.56 |
| Example 14 | > | 1.01 | > | 1.76 |

TABLE 1-3

| | Change Rate of Surface Displacement Amount Over Time | | | | | |
|---|---|---|---|---|---|---|
| | Drive Pulse Signal A | | | Drive Pulse Signal B | | |
| | After driving $3.6 \times 10^8$ times [%] | After leaving 24 hours [%] | Determination result | After driving $3.6 \times 10^8$ times [%] | After leaving 24 hours [%] | Determination result |
| Comparative Example 1 | 80.1 | 100.3 | Not good | 80.1 | 100.3 | Not good |
| Comparative Example 2 | 85.1 | 106.2 | Not good | 85.1 | 106.2 | Not good |
| Comparative Example 3 | 92.5 | 104.1 | Not good | 92.5 | 104.1 | Not good |
| Comparative Example 4 | 96.4 | 103.1 | Good | 96.4 | 103.1 | Not good |
| Example 1 | 97.1 | 102.6 | Good | 97.1 | 102.6 | Not good |
| Example 2 | 98.1 | 99.9 | Good | 98.1 | 99.9 | Not good |
| Example 3 | 97.6 | 101.3 | Good | 97.6 | 101.3 | Not good |
| Example 4 | 97.7 | 101.3 | Good | 97.7 | 101.3 | Not good |
| Example 5 | 98.4 | 100.6 | Good | 98.4 | 100.6 | Not good |
| Example 6 | 97.2 | 100.0 | Good | 97.2 | 100.0 | Not good |
| Example 7 | 98.6 | 100.2 | Good | 98.6 | 100.2 | Not good |
| Example 8 | 98.6 | 99.9 | Good | 98.6 | 99.9 | Good |
| Example 9 | 97.5 | 102.5 | Good | 97.5 | 102.5 | Good |
| Example 10 | 98.6 | 100.1 | Good | 98.6 | 100.1 | Good |
| Example 11 | 98.5 | 100.4 | Good | 98.5 | 100.4 | Good |
| Example 12 | 99.3 | 100.5 | Good | 99.3 | 100.5 | Good |
| Example 13 | 99.2 | 99.9 | Good | 99.2 | 99.9 | Good |
| Example 14 | 99.1 | 100.1 | Good | 99.1 | 100.1 | Good |

In the polarization characteristic (hysteresis characteristic) of the first piezoelectric film, "−Ec" and "+Ec" show initial coercive fields of the negative polarity side and the positive polarity side of the electromechanical transducer, respectively. In addition, "−$Ec^P$" and "+$Ec^P$" show a coercive field of the negative polarity side and a coercive field of the positive polarity side after the polarization process to apply the voltage of the positive polarity is executed, respectively. In addition, "$Ec^{Pav}$" shows an average (=(|−$Ec^P$|+$Ec^P$)/2) of absolute values of the coercive field −$Ec^P$ and the coercive field $Ec^P$.

In Table 1, a value of |−$Ec^P$−(−Ec)| is a parameter used to determine quality of the polarization process contributing to suppression of the temporal decrease of the surface displacement amount of the piezoelectric film. The quality of the polarization process contributing to the suppression of the temporal decrease of the surface displacement amount of the piezoelectric film is determined on the basis of a magnitude relation of the value of |−$Ec^P$−(−Ec)| and the predetermined reference values A and B. Here, the reference value A is 0.15×$Ec^{Pav}$ and is used to determine the quality of the polarization process when the drive pulse signal A of FIG. 13A is applied. In addition, the reference value B is 0.26×$Ec^{Pav}$ and is used to determine the quality of the polarization process when the drive pulse signal B of FIG. 13B is applied.

In addition, in Table 1, each of columns of two inequality signs (there is an equality sign in one place) shows a magnitude relation of the predetermined reference values A and B and the value of |−$Ec^P$−(−Ec)|.

In addition, in Table 1, a column of the determination result shows a determination result of the quality of the polarization process contributing to the suppression of the temporal decrease of the surface displacement amount of the piezoelectric film and "good" and "not good" are determined as follows. When the change rate of the surface displacement amount after the drive pulse signal is repetitively applied 3.6×10⁸ times is 97 [%] or more with respect to an initial value and the change rate of the surface displacement amount after leaving for 24 hours is 103 [%] or less with respect to the initial value thereafter, the determination result is determined as "good". Meanwhile, when the change rate of the surface displacement amount after the drive pulse signal is repetitively applied 3.6×10⁸ times is smaller than 97 [%] with respect to the initial value or the change rate of the surface displacement amount after leaving for 24 hours is larger than 103 [%] with respect to the initial value thereafter, the determination result is determined as "not good".

From Table 1, it is found that the following results are obtained when the drive pulse signals A and B are applied. When the drive pulse signal A is applied, the polarization process is executed such that the hysteresis characteristic satisfying the following expressions [1] and [2] is obtained. Thereby, the temporal decrease of the surface displacement amount when the voltage is applied to the piezoelectric film can be suppressed in a range from 97 [%] to 103 [%].

$$-Ec^P-(-Ec)<0 \qquad [\text{Expression 1}]$$

$$|-Ec^P-(-Ec)|>0.15\times Ec^{Pav} \qquad [\text{Expression 2}]$$

When the drive pulse signal B of the minor loop drive is applied, the polarization process is executed such that the hysteresis characteristic satisfying the following expressions [3] and [4] is obtained. Thereby, the temporal decrease of the surface displacement amount when the voltage is applied to the piezoelectric film can be suppressed in a range from 97 [%] to 103 [%].

$$Ec^P-(-Ec)<0 \qquad [\text{Expression 3}]$$

$$|-Ec^P-(-Ec)|>0.26\times Ec^{Pav} \qquad [\text{Expression 4}]$$

Figure 14:
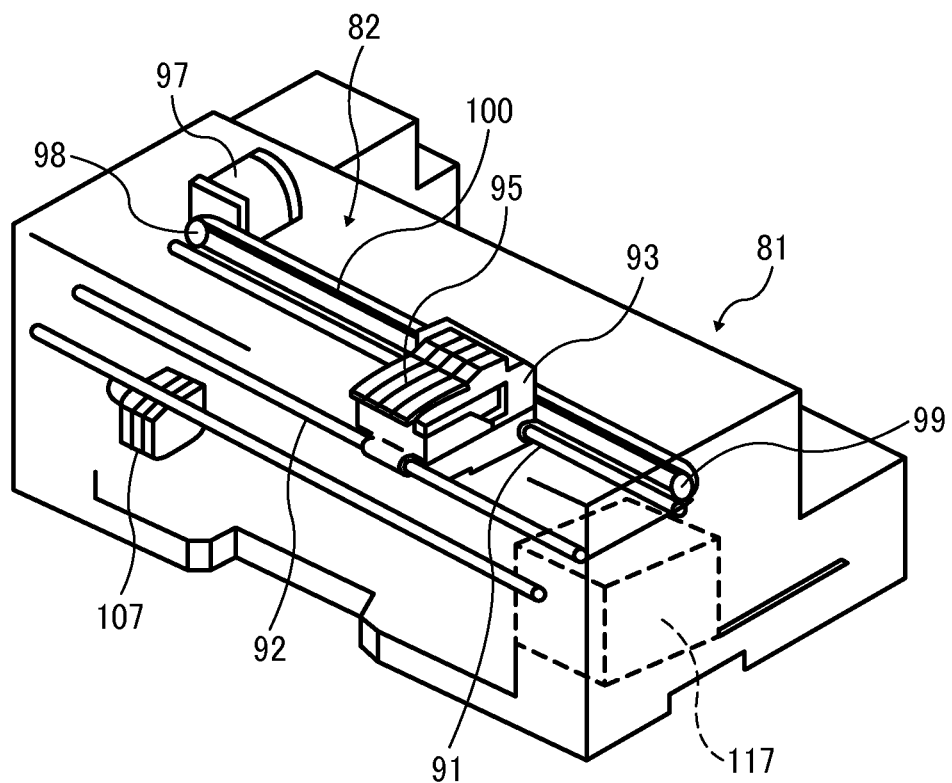
FIG. 14 is a perspective view illustrating an example of an inkjet recording apparatus according to an embodiment.
Figure 15:
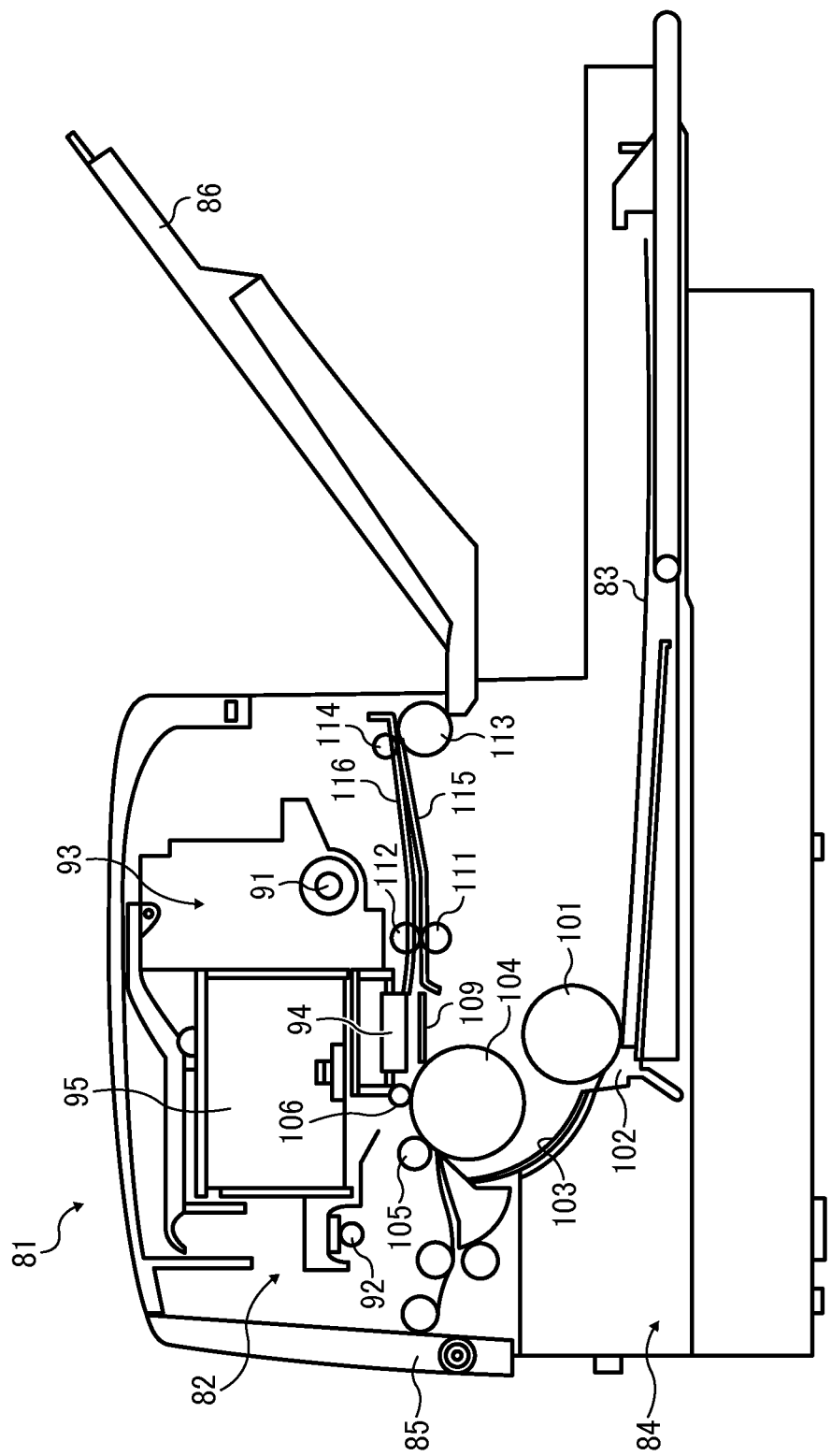
FIG. 15 is a lateral view illustrating an assembly of the inkjet recording apparatus.

Next, an inkjet recording apparatus functioning as an image forming apparatus (droplet discharge apparatus) on which the droplet discharge head according to this embodiment is mounted will be described. FIG. 14 is a perspective view illustrating an example of the inkjet recording apparatus according to this embodiment and FIG. 15 is a lateral view illustrating an assembly of the inkjet recording apparatus. In the inkjet recording apparatus according to this embodiment, a printing assembly 82 is stored in a recording apparatus body 81. The printing assembly 82 includes a carriage 93 that can move in a main scanning direction and an ink cartridge 95 functioning as a liquid cartridge that supplies ink to be a liquid for image formation to the droplet discharge head 94 mounted on the carriage 93. A sheet feeding cassette (or sheet feeding tray) 84 that can load sheets 83 corresponding to multiple recording media from the front side can be removably mounted on a lower portion of the recording apparatus body 81. In addition, a manual feed tray 85 to manually feed the sheets 83 can be thrown down and opened. In addition, the sheets 83 fed from the sheet feeding cassette 84 or the manual feed tray 85 are taken, a necessary image is recorded by the printing assembly 82, and the sheets 83 are ejected to an ejection tray 86 mounted on the rear side.

The printing assembly 82 slidably holds the carriage 93 in the main scanning direction by a main guide rod 91 and a sub-guide rod 92 to be guide members bridged laterally between left and right side plates. In the carriage 93, nozzles functioning as a plurality of ink discharge ports are arranged in a direction crossing the main scanning direction and a plurality of droplet discharge heads 94 are mounted with a droplet discharge direction as a downward direction. The plurality of droplet discharge heads 94 are heads (inkjet heads) to discharge droplets of individual colors of yellow (Y), cyan (C), magenta (M), and black (Bk). In addition, each ink cartridge 95 to supply a liquid (ink) of each color to the droplet discharge head 94 is mounted on the carriage 93 to be exchangeable.

The ink cartridge 95 has an air port communicating with the atmosphere at the upper side, has a supply port to supply ink to the inkjet heat at the lower side, and has a porous material into which ink is filled at the inner side. A liquid (ink) supplied to the droplet discharge head 94 by capillary force of the porous material is maintained in slight negative pressure. In this embodiment, the four droplet discharge heads 94 corresponding to the individual colors are used. However, one droplet discharge head that has a plurality of nozzles to discharge droplets of each color may be used.

Here, the rear side (the downstream side of a sheet conveyance direction) of the carriage 93 is slidably fit into the main guide rod 91 and the rear side thereof (the upstream side of the sheet conveyance direction) is slidably placed on the sub-guide rod 92. In addition, a timing belt 100 is stretched between a driving pulley 98 driven to rotate by a main scanning motor 97 and a driven pulley 99 to move the carriage 93 in the main scanning direction. The timing belt 100 is fixed on the carriage 93 and the carriage 93 is reciprocatingly driven by forward and reverse rotation of the main scanning motor 97.

Meanwhile, a sheet feeding roller 101, a friction pad 102, a guide 103, a conveyance roller 104, and a leading edge roller 106 are included to convey the sheets 83 set to the sheet feeding cassette 84 to the lower side of a head 94. The sheet feeding roller 101 and the friction pad 102 separate and feed the sheets 83 from the sheet feeding cassette 84 and the guide 103 guides the sheets 83. In addition, the conveyance roller 104 inverts the fed sheets 83 and conveys the sheets 83. The leading edge roller 106 defines a feeding angle of the sheets 83 from a conveyance roller 105 pushed to a circumferential surface of the conveyance roller 104 and the conveyance roller 104. The conveyance roller 104 is driven to rotate through a gear train by a sub-scanning motor 107.

In addition, a printing receiver 109 to be a sheet guide that guides the sheets 83 fed from the conveyance roller 104 at the lower side of the droplet discharge head 94 to correspond to a movement range of the main scanning direction of the carriage 93 is provided. On the downstream side of the sheet conveyance direction of the printing receiver 109, a conveyance roller 111 and a spur roller 112 driven to rotate to feed the sheets 83 in an ejection direction are provided. In addition, an ejection roller 113 and a spur roller 114 to feed the sheets 83 to the ejection tray 86 and guides 115 and 116 to form an ejection pathway are arranged.

At the time of recording, the droplet discharge head 94 is driven according to an image signal while the carriage 93 is moved, ink is discharged to the stopped sheets 83, recording of one row is performed, and recording of a next row is performed after the sheets 83 are conveyed by a predetermined amount. When a recording end signal or a signal showing that rear ends of the sheets 83 arrive at a recording area is received, a recording operation is terminated and the sheets 83 are ejected.

In addition, a recovery device 117 to recover discharge failure of the droplet discharge head 94 is arranged at a position deviating from a recording area of the right end side of a movement direction of the carriage 93. The recovery device 117 has a capping unit, a suction unit, and a cleaning unit. The carriage 93 moves to the side of the recovery device 117 in a printing standby mode, the droplet discharge head 94 is capped by the capping unit, the nozzle to be the discharge port is maintained in a wet state, and the discharge failure is prevented from occurring due to ink drying. In addition, ink discharge not associated with the recording is performed in the middle of the recording, so that ink viscosity of all discharge ports is constantly maintained, and stable discharging performance is maintained.

When the discharge failure occurs, the discharge ports (nozzles) of the droplet discharge head 94 are sealed by the capping unit and ink and bubbles are sucked from the discharge ports by the suction unit through a tube. Thereby, ink or dusts adhered to a discharge port face is removed by the cleaning unit and the discharge failure is recovered. In addition, the sucked ink is ejected to a waste ink container arranged on a lower portion of the body, is absorbed into an ink absorber in the waste ink container, and is held in the ink absorber.

In the inkjet recording apparatus, the droplet discharge heads manufactured in the embodiment and the examples 1 and 2 are mounted. Therefore, the discharge failure of the ink droplets does not occur due to the drive failure of the diaphragm and the change of the surface displacement of the piezoelectric actuator is suppressed. Therefore, a stable ink droplet discharge characteristic is obtained and image quality is improved.

In the above-described embodiments, an image forming apparatus discharges droplets from droplet discharge heads to land the droplets on a recording medium to form an image on the recording medium. However, in some embodiments, the teachings of the present disclosure is applicable to a droplet discharge device other than such an image forming apparatus having the droplet discharge head. For example, in some embodiments, a recording medium onto which droplets for image formation are landed and applied is a medium (a recording medium, a transfer material, or a recording sheet) other than a sheet of paper, such as string, fiber, cloth, leather, metal, plastic, glass, timber, and ceramic. In some embodiment, the teachings of this disclosure is applied to a device that provides not only meaningful images such as characters and figures but meaningless images such as patterns to the medium, in other words, a device that simply discharges droplets). In some embodiments, the teachings of this disclosure is applied to a droplet discharge device that discharges liquid resist for patterning to land the resist on a medium. In some embodiments, the teachings of this disclosure is applied to a droplet discharge device that discharges liquid resist for patterning to land the resist on a medium. In some embodiments, the teachings of this disclosure is applied to a droplet discharge device that discharges a genetic analysis sample to land on a medium or a droplet discharge device for a three-dimensional modeling.

The above description is exemplary and the present disclosure achieves a particular effect for each of the following aspects.

(Aspect A)

A method of manufacturing an electromechanical transducer, including:

forming a first electrode such as a lower electrode 203 on a substrate or a base film;

forming a piezoelectric film 204 made of PZT on the first electrode;

forming a second electrode such as an upper electrode 205 on the piezoelectric film 204;

executing a polarization process on the piezoelectric film 204, wherein the polarization process is a process for applying a positive polarity voltage to the second electrode, on the basis of a potential of the first electrode, and when an initial coercive field of the negative polarity side of the electromechanical transducer is set to −Ec, a coercive field of the negative polarity side and a coercive field of the positive polarity side after the polarization process to apply the positive polarity voltage is executed are set to $-Ec^P$ and $Ec^P$, respectively, and an average of absolute values of the coercive field $-Ec^P$ and the coercive field $Ec^P$ is set to $Ec^{Pav}$ $(=(|-Ec^P|+Ec^P)/2)$, the following expressions [1] and [2] are satisfied.

$$-Ec^P-(-Ec)<0 \qquad \text{[Expression 1]}$$

$$|-Ec^P-(-Ec)|>0.15\times Ec^{Pav} \qquad \text{[Expression 2]}$$

According to this aspect, as described in the experiment results of the examples 1 to 14 in the embodiment, the polarization process is executed such that the piezoelectric film satisfying the expressions [1] and [2] is obtained, so that lattice vacancies having effective charges in the piezoelectric film are moved to an end of a thickness direction of the piezoelectric film. As such, an internal field Ei accelerating spontaneous polarization of PZT o the piezoelectric film is generated by the charges of the lattice vacancies moved to the end of the thickness direction of the piezoelectric film and a polarization state of the piezoelectric film can be stabilized. Thereby, a decrease in deformation amount (surface displacement amount) at the time of applying a voltage to the piezoelectric film after the predetermined drive pulse signal A is repetitively applied 3.6×10⁸ times can be suppressed to not less than 97% of a deformation amount before the drive pulse signal is repetitively applied.

(Aspect B)

In the aspect A, the following expressions [3] and [4] are satisfied.

$$-Ec^P-(-Ec)<0 \qquad \text{[Expression 3]}$$

$$|-Ec^P-(-Ec)|>0.26\times Ec^{Pav} \qquad \text{[Expression 4]}$$

According to this aspect, as described in the embodiment and the examples 8 to 14, even when the predetermined drive pulse signal B of the minor loop drive in which deformation is easy as compared with the drive pulse signal A is applied, a decrease in deformation amount (surface displacement amount) at the time of applying a voltage to the piezoelectric film after the drive pulse signal B is repetitively applied 3.6×10⁸ times can be suppressed to not less than 97% of a deformation amount before the drive pulse signal is repetitively applied.

(Aspect C)

In the aspect A or B, the polarization process is executed by a circuit in which a direct-current power supply and the electromechanical transducer are connected in series via a capacitor.

According to this aspect, as described in the embodiment, the polarization process can be executed at high field strength while breakdown is prevented.

(Aspect D)

An electromechanical transducer, including:

a first electrode that is formed on a substrate or a base film;

a piezoelectric film that is formed on the first electrode; and a second electrode that is formed on the piezoelectric film;

wherein the electromechanical transducer is manufactured by the method according to any one of the aspects A to C.

According to this aspect, as described in the embodiment, a temporal degradation of a deformation amount at the time of applying a voltage to an electromechanical transduction film can be surely suppressed.

(Aspect E)

A droplet discharge head including the electromechanical transducer manufactured by the method according to any one of the aspects A to C.

According to this aspect, as described in the embodiment, a temporal degradation of a droplet discharge characteristic can be surely suppressed.

(Aspect F)

A droplet discharge apparatus including the droplet discharge head according to the aspect E.

According to this aspect, as described in the embodiment, a temporal degradation of a droplet discharge characteristic can be surely suppressed.

(Aspect G)

An image forming apparatus including the droplet discharge head according to the aspect E.

According to this aspect, as described in the embodiment, a temporal degradation of a droplet discharge characteristic can be surely suppressed.

According to an embodiment of the present disclosure, when a piezoelectric film is formed of PZT, a decrease in deformation amount (surface displacement amount) of the piezoelectric film after a predetermined drive pulse signal is repetitively applied 3.6×10⁸ times can be suppressed to not less than 97% of a deformation amount before the drive pulse signal is repetitively applied.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A method of manufacturing an electromechanical transducer, the method comprising:
forming a first electrode on a substrate or a base film;
forming a piezoelectric film made of lead zirconate titanate on the first electrode;
forming a second electrode on the piezoelectric film; and
polarizing the piezoelectric film, the polarizing including
applying a direct-current voltage to the second electrode from a direct-current power supply connected in series to the electromechanical transducer via a capacitor, and applying to the second electrode a positive polarity voltage having a positive polarity relative to a potential of the first electrode, and
satisfying a first expression of $-Ec^P-(-Ec)<0$ and a second expression of $|-Ec^P-(-Ec)|>0.15\times Ec^{Pav}$,
where $-Ec$ represents a coercive field of a negative polarity side prior to the polarizing of the electromechanical transducer,
$-Ec^P$ represents a coercive field of the negative polarity side of the electromechanical transducer after the applying of the positive polarity voltage to the second electrode,
$Ec^P$ represents a coercive field of a positive polarity side of the electromechanical transducer after the applying of the positive polarity voltage to the second electrode, and
$Ec^{Pav}$ represents an average of an absolute value of the coercive field $-Ec^P$ and an absolute value of the coercive field $Ec^P$, wherein the capacitor is a metalized polypropylene capacitor.

2. The method according to claim 1, further comprising satisfying a third expression of $-Ec^P-(-Ec)<0$ and a fourth expression of $|-Ec^P-(-Ec)|>0.26\times Ec^{Pav}$.

3. An electromechanical transducer manufactured by the method according to claim 1.

4. A droplet discharge head comprising the electromechanical transducer manufactured by the method according to claim 1.

5. A droplet discharge apparatus comprising the droplet discharge head according to claim 4.

6. An image forming apparatus comprising the droplet discharge head according to claim 4.

* * * * *